United States Patent [19]
Unami et al.

[11] Patent Number: 5,925,970
[45] Date of Patent: Jul. 20, 1999

[54] PIEZOELECTRIC RESONATOR AND ELECTRONIC COMPONENT CONTAINING SAME

[75] Inventors: Toshihiko Unami; Jiro Inoue, both of Omihachiman, Japan

[73] Assignee: Murata Manufacturing Co., Ltd., Kyoto, Japan

[21] Appl. No.: 08/829,597

[22] Filed: Mar. 31, 1997

[30] Foreign Application Priority Data

Apr. 5, 1996 [JP] Japan .................................. 8-110475

[51] Int. Cl.$^6$ .................................................. H01L 41/08
[52] U.S. Cl. ......................... 310/328; 310/344; 310/348; 310/358; 310/366
[58] Field of Search ................................. 310/328, 325, 310/344, 366, 358, 359

[56] References Cited

U.S. PATENT DOCUMENTS

| | | | |
|---|---|---|---|
| 2,157,665 | 5/1939 | Hollmann | 310/315 |
| 2,998,535 | 8/1961 | Church et al. | 310/325 |
| 3,185,869 | 5/1965 | Shoor | 310/315 |
| 3,187,207 | 6/1965 | Tomes | 310/325 |
| 3,297,889 | 1/1967 | Breskend | 310/315 |
| 3,390,287 | 6/1968 | Sonderegger | 310/323 |
| 3,401,275 | 9/1968 | Curran et al. | |
| 3,590,287 | 6/1971 | Berlincourt et al. | 310/366 X |
| 4,087,716 | 5/1978 | Haywang | 310/359 X |
| 4,193,009 | 3/1980 | Durley, III | 310/323 |
| 4,360,754 | 11/1982 | Toyoshima et al. | 310/366 |
| 4,398,117 | 8/1983 | St. Cyr | 310/348 |
| 4,503,352 | 3/1985 | Inoue | 333/187 X |
| 4,532,451 | 7/1985 | Inoue | 310/359 X |
| 4,542,315 | 9/1985 | Yamamoto et al. | 310/348 |
| 4,564,782 | 1/1986 | Ogawa | 333/191 X |
| 4,570,098 | 2/1986 | Tomita et al. | 310/346 |
| 4,608,509 | 8/1986 | Yamamoto et al. | 310/344 X |
| 4,633,120 | 12/1986 | Sato et al. | 310/328 |
| 4,642,510 | 2/1987 | Yamashita | 310/348 |
| 4,656,385 | 4/1987 | Tanaka | 310/348 |
| 4,752,712 | 6/1988 | Tomita et al. | 310/328 |
| 4,759,107 | 7/1988 | Ogawa et al. | 310/366 X |
| 4,780,639 | 10/1988 | Shirasu | 310/328 |
| 4,885,498 | 12/1989 | Wakita | 310/328 |
| 5,045,744 | 9/1991 | Ando et al. | 310/366 X |
| 5,118,982 | 6/1992 | Inoue et al. | 310/328 X |
| 5,126,618 | 6/1992 | Takahashi et al. | 310/346 |
| 5,153,477 | 10/1992 | Jomura et al. | 310/366 X |
| 5,225,731 | 7/1993 | Owen | 310/366 |
| 5,233,256 | 8/1993 | Hayashi et al. | 310/317 |
| 5,237,239 | 8/1993 | Inoue et al. | 310/328 |
| 5,241,236 | 8/1993 | Sasaki et al. | 310/358 |
| 5,250,870 | 10/1993 | Fenlon et al. | 310/345 |
| 5,381,067 | 1/1995 | Greenstein | 310/359 X |
| 5,438,232 | 8/1995 | Inoue et al. | 310/328 |
| 5,446,485 | 8/1995 | Usui | 347/72 |
| 5,517,073 | 5/1996 | Ohkuma | 310/315 |
| 5,523,645 | 6/1996 | Inoi | 310/328 X |
| 5,525,944 | 6/1996 | Oyama | 333/189 |
| 5,548,179 | 8/1996 | Kaida | 310/348 X |
| 5,565,824 | 10/1996 | Nagano | 333/189 |
| 5,572,082 | 11/1996 | Sokol | 310/366 |
| 5,585,687 | 12/1996 | Wakabayashi et al. | 310/366 |
| 5,596,243 | 1/1997 | Tsuru et al. | 310/348 |
| 5,596,244 | 1/1997 | Kugou et al. | 310/348 |
| 5,696,472 | 12/1997 | Kaida | 333/189 |
| 5,705,880 | 1/1998 | Shimura et al. | 310/366 |
| 5,717,365 | 2/1998 | Kaida et al. | 333/187 |

FOREIGN PATENT DOCUMENTS 5-160459  6/1993  Japan .................................. 310/366

*Primary Examiner*—Mark O. Budd
*Attorney, Agent, or Firm*—Graham & James LLP

[57] ABSTRACT

A piezoelectric resonator has a base member including laminated piezoelectric layers and internal electrodes. The base member is polarized in different directions at both sides of each internal electrode. The internal electrodes are alternately covered by insulating film on opposing side surfaces of the base member. External electrodes are formed on the opposing side surfaces of the base member and the internal electrodes are connected thereto, respectively. At both ends of the base member, inactive sections are formed such that an electric field is not applied to the base member by covering consecutive plural electrodes with the insulating film. The center of the base member serves as an active section since an electric field is applied.

20 Claims, 22 Drawing Sheets

PIEZOELECTRIC RESONATOR AND ELECTRONIC COMPONENT CONTAINING SAME

BACKGROUND OF THE INVENTION

1. Field of the Invention

The present invention relates to piezoelectric resonators and electronic components containing the same, and more particularly, to a piezoelectric resonator which maximizes the effective use of the mechanical resonance of a piezoelectric member, and electronic components using the piezoelectric resonator, such as an oscillator, a discriminator, and a filter.

2. Description of the Related Art

FIG. 39 is a perspective view of a conventional piezoelectric resonator. A piezoelectric resonator 1 includes a single piezoelectric substrate 2 having, for example, a rectangular plate shape as viewed from above. The single piezoelectric substrate 2 is polarized in the thickness direction. On two opposite major surfaces of the single piezoelectric substrate 2, electrodes 3 are provided. When a signal is input between the electrodes 3, an electrical field is applied to the single piezoelectric substrate 2 in the thickness direction and the single piezoelectric substrate 2 vibrates in the longitudinal direction. In FIG. 40, there is shown a piezoelectric resonator 1 in which electrodes 3 are provided on two opposite major surfaces of a single piezoelectric substrate 2 having a square plate shape as viewed from above. The single piezoelectric substrate 2 of the piezoelectric resonator 1 is polarized in the thickness direction. When a signal is input between the electrodes 3 in the piezoelectric resonator 1, an electrical field is applied to the single piezoelectric substrate 2 in the thickness direction and the single piezoelectric substrate 2 vibrates in a square-type vibration mode (in the plane direction).

These piezoelectric resonators shown in FIGS. 39 and 40 are of an unstiffened type, in which the vibration direction differs from the direction of polarization and the electrical field direction. The electromechanical coupling coefficient of such an unstiffened piezoelectric resonator is lower than that of a stiffened piezoelectric resonator in which each of the vibration direction, the direction of polarization, and the direction in which an electrical field is applied are the same.

An unstiffened piezoelectric resonator has a relatively small frequency difference ΔF between the resonant frequency and the anti-resonant frequency. This leads to a drawback in which a frequency-band width in use is narrow when an unstiffened frequency resonator is adapted to be used as an oscillator or a filter. Therefore, the degree of freedom and flexibility in resonator characteristics design is low in such a piezoelectric resonator and electronic components including such resonators.

The piezoelectric resonator shown in FIG. 39 uses the first-order resonance in the longitudinal mode. Because of its structure, the piezoelectric resonator of FIG. 39 also generates large spurious resonances in odd-number-order harmonic modes, such as the third-order and fifth-order modes, and in a width mode. To suppress these spurious resonances, some solutions have been considered, such as polishing, increasing mass, and changing the shape of the electrode. These solutions increase manufacturing cost.

In addition, since the single piezoelectric substrate has a rectangular plate shape, the single substrate cannot be made thinner without sacrificing required strength. Therefore, the distance between the electrodes cannot be reduced and a capacitance between terminals cannot be increased. This makes it extremely difficult to achieve impedance matching with an external circuit. To form a ladder filter by alternately connecting a plurality of piezoelectric resonators in series and in parallel, the capacitance ratio of the series resonator to the parallel resonator needs to be made large in order to increase attenuation. Because a piezoelectric resonator has the shape and structural restrictions described above, however, large attenuation cannot be obtained.

In the piezoelectric resonator shown in FIG. 40, large spurious resonances such as those in the thickness mode and in the triple-wave mode in the plane direction are generated. Since the piezoelectric resonator must have a large size as compared with a piezoelectric resonator using the longitudinal vibration in order to obtain the same resonant frequency, it is difficult to reduce the size of the piezoelectric resonator shown in FIG. 40. When a ladder filter is formed by a plurality of piezoelectric resonators, in order to increase the capacitance ratio between the series resonator and the parallel resonator, the resonators connected in series must have an increased thickness and electrodes are formed only on part of a piezoelectric substrate to make the capacitance small. In this case, since the electrodes are only partially formed, the difference ΔF between the resonant frequency and the anti-resonant frequency as well as the capacitance is reduced. The resonators connected in parallel are accordingly required to have small ΔF. As a result, the piezoelectricity of the piezoelectric substrate is not effectively used, and the transmission band width of the filter cannot be increased.

In the prior art, such as U.S. Pat. No. 5,250,868, a piezoelectric effect device includes a sintered stack of piezoelectric elements which stack is completely enclosed in a flexible metal housing to be used as an actuator. The stack includes non-active portions $I_1$ and $I_n$ located at the ends of the stack for protecting the active portions $I_2$ through $I_{n-1}$. In order to function as an actuator, the stack 3 of piezoelectric elements must be supported at one end and must be free to vibrate in a longitudinal mode at the other end. Thus, the stack 3 could not be supported at a point other than the one end and therefore, the stack 3 could not be supported at a central or middle portion of the stack 3 without destroying the operability of the stack 3 as an actuator. In addition, the stack 3 of piezoelectric elements must achieve maximum displacement required for actuators and therefore, the stack 3 must have a node point located only at the supported end of the stack 3. The stack 3 cannot have a node point located at a central or middle portion of the stack, otherwise the stack 3 could not function as an actuator. By arranging the stack 3 to have a node point at one end and to be supported at the same end, the stack 3 can achieve the maximum desired displacement necessary in an actuator.

In addition, U.S. Pat. No. 4,633,120 teaches an electrostriction transducer including a plurality of electrostriction layers, not piezoelectric layers, stacked on each other and including protection or dummy layers on each end of the stack of electrostriction layers for protecting the stack of electrostrictive layers. The electrostriction layers are very different from piezoelectric elements and cannot function in the same manner as piezoelectric elements, as is well known.

The prior art stacked devices are only adapted to function as an actuator or electrostrictive transducer, and could not function as a resonator. Therefore, a location of a resonant point and an anti-resonant point and an amount of capacitance is of no concern in these types of devices. Accordingly, the prior art stacked devices have electrodes provided at both ends of the stack of piezoelectric or electrostriction members. These electrodes cannot be located along a longitudinal side edge of the stack in order for the stacked devices to function as an actuator or transducer. Furthermore, these prior art devices cannot have a node located at a central or middle portion of a stack of piezoelectric elements or be supported at a node located at a central or middle portion of the stack.

In addition, the only purpose for providing the protection or dummy layer is to protect the piezoelectric or electrostriction layers surrounded by the protection or dummy layers. The stacked piezoelectric or electrostrictive layers of the prior art are not arranged or adapted to function as a resonator which can be used in an oscillator, a discriminator, or a filter.

SUMMARY OF THE INVENTION

The preferred embodiments of the present invention provide a piezoelectric resonator having a small spurious resonance, a large difference $\Delta F$ between a resonant frequency and an anti-resonant frequency, an easily adjustable location of a resonant point and anti-resonant point, an easily adjustable capacitance and $\Delta F$, and a large degree of freedom in resonator characteristics design.

The preferred embodiments of the present invention also provide a piezoelectric resonator including a piezoelectric base member having an active section and an inactive section, wherein a node is defined at a central portion of the piezoelectric base member and the resonator may preferably be supported at the node located at the central portion of the piezoelectric base member.

According to one preferred embodiment of the present invention, a piezoelectric resonator includes a base member formed of a piezoelectric material; an active section constituting a first part of the base member, the active section being formed by a portion of the piezoelectric base member which is polarized in a longitudinal direction of the base member and generates a longitudinal vibration in the base member when an electric field is applied in the longitudinal direction of the base member; at least one pair of electrodes disposed in the active section such that the electrodes are substantially perpendicular to the longitudinal direction of the base member; and at least one inactive section constituting a second portion of the base member, the inactive section being not polarized and/or not energized by an electric field.

The piezoelectric base member is preferably comprised of a single, integral stack of piezoelectric resonators or elements. The piezoelectric base member may be formed of a single unitary piezoelectric member or may be formed by joining a plurality of separate piezoelectric members through a suitable connecting material or method such as adhesive.

Although one or more inactive sections may be disposed at any location within the piezoelectric base, it is preferred in one preferred embodiment of the piezoelectric resonator that an inactive section be disposed at two opposite ends of the active section, and that the active section comprise at least about 50% or more of the length of the base member.

In a preferred embodiment, the active section constitutes a central portion of the piezoelectric base member and there are two inactive sections each provided at one of the ends of the active section such that the active section is surrounded by inactive sections at opposite ends thereof. The piezoelectric base member is preferably arranged such that a node is defined at a center or midpoint of the active section thereby allowing the piezoelectric resonator to be supported at the node without affecting the resonator characteristics.

The inactive section may be formed in many ways. First, the inactive section may be formed without an electrode material disposed thereon. As a result, the inactive section without an electrode cannot be polarized or receive an electric field. Alternatively, the inactive section may be provided with an electrode material but the inactive section is not polarized so it does not generate vibration, and is therefore inactive.

The piezoelectric resonator may further include a support member, and a mounting member disposed between the support member and preferably an approximate center section of the base member. The mounting member may be preferably located at a node of the piezoelectric base member as described above.

Another preferred embodiment of the present invention provides an electronic component containing the above-described piezoelectric resonator, wherein the support member comprises an insulating substrate on which a pattern electrode is provided; the base member is mounted to the insulating substrate via the mounting member; and a cap is preferably disposed on the insulating substrate so as to cover the base member.

In another preferred embodiment of the present invention, an electronic component includes the above-described piezoelectric resonator, wherein the support member comprises an insulating substrate on which a pattern electrode is provided; a plurality of the base members are connected in series and in parallel in a ladder arrangement on the insulating substrate via the mounting member; and a cap is preferably disposed on the insulating substrate so as to cover the base member.

The piezoelectric resonator according to the preferred embodiments of the present invention is a stiffened type, and has an active section in which the vibration direction, the direction of polarization, and the direction in which an electrical field is applied are the same. Therefore, as compared with an unstiffened piezoelectric resonator in which the vibration direction differs from the direction of polarization and electrical field, the stiffened piezoelectric resonator has a larger electromechanical coupling coefficient and a larger frequency difference $\Delta F$ between the resonant frequency and the anti-resonant frequency. In addition, vibrations in modes such as the width and thickness modes, which are different from the basic vibration, are unlikely to occur in a stiffened piezoelectric resonator. Furthermore, the capacitance can be adjusted by changing the number of electrodes which are used for applying an electric field to the active section, the distances thereof, and the size thereof. The frequency difference $\Delta F$ can be adjusted by reducing or increasing the size or mass of an inactive section.

When electronic components such as an oscillator, a discriminator, and a filter are constructed to include the piezoelectric resonator according to the preferred embodiments of the present invention, the piezoelectric resonator is preferably mounted on an insulating substrate on which pattern electrodes are provided and the resonator is preferably covered by a cap to form chip-type electronic components which are capable of being surface mounted.

According to the preferred embodiments of the present invention, the frequency difference $\Delta F$ between the resonant frequency and the anti-resonant frequency is large as compared with a conventional piezoelectric resonator, and thus a wide-frequency-band resonator is obtained. Since the frequency difference $\Delta F$ can be easily adjusted by adjusting the size or mass of the inactive section, the frequency-band width of the piezoelectric resonator can be easily changed. In addition, vibrations in modes other than the basic-vibration mode are unlikely to occur in this piezoelectric resonator, and superior resonator characteristics are achieved. Furthermore, since the capacitance of the piezoelectric resonator can be easily adjusted, it is easy to achieve impedance matching with an external circuit when the piezoelectric resonator is mounted on a circuit board.

Since a chip-type electronic component can be made using the piezoelectric resonator of the preferred embodiments, it is easy to mount the component on a circuit board. It is also easy to achieve impedance matching between such an electronic component and an external circuit by adjusting the capacitance of the piezoelectric resonator. In addition, in a ladder filter formed by alternately connecting a plurality of piezoelectric resonators in series and in parallel, attenuation in the filter can be adjusted by changing the ratio of the capacitance of the piezoelectric resonator connected in series to that of the piezoelectric resonator connected in parallel.

These and other elements, features, and advantages of the preferred embodiments of the present invention will be apparent from the following detailed description of the preferred embodiments of the present invention, as illustrated in the accompanying drawings.

DETAILED DESCRIPTION OF PREFERRED EMBODIMENTS

Figure 1:
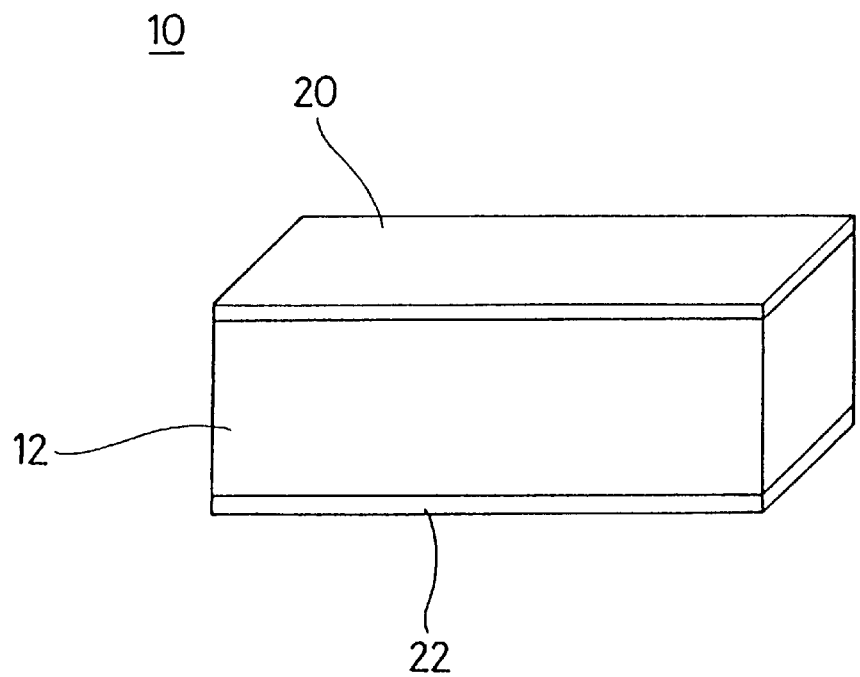
FIG. 1 is a perspective view of a piezoelectric resonator according to a preferred embodiment of the present invention.
Figure 2:
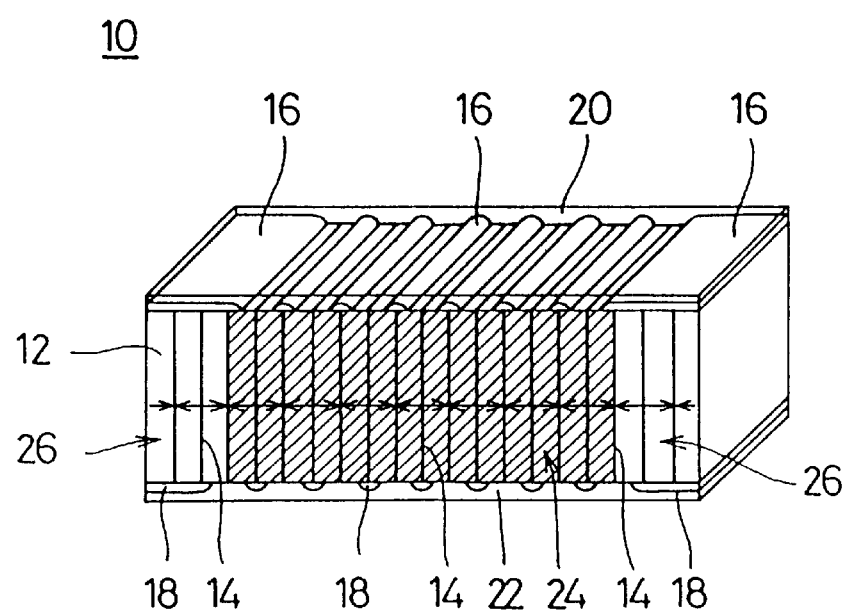
FIG. 2 is a view showing the structure of the piezoelectric resonator shown in FIG. 1.

FIG. 1 is a perspective view of a piezoelectric resonator according to a preferred embodiment of the present invention. FIG. 2 shows the internal structure of the piezoelectric resonator shown in FIG. 1. The piezoelectric resonator 10 includes a base member 12 preferably having, for example, a substantially cubic shape, although other shapes may also be used. The base member 12 is made from, for example, a piezoelectric ceramic material. A plurality of electrodes 14 are provided on the base member 12 such that the major surfaces of the electrodes 14 are substantially perpendicular to a longitudinal direction of the base member 12. The base member 12 is preferably polarized in opposite directions at both sides of at least one of the electrodes 14 as seen in FIG. 2.

On opposing side surfaces of the base member 12, a plurality of insulating films 16 and 18 are provided, respectively. On a first side surface of the base member 12, the insulating film 16 covers the exposed section of every other electrode 14. On a second side surface of the base member 12, the insulating film 18 covers the exposed section of every other electrode 14 not covered by the insulating film 16 on the first side surface. However, some electrodes 14 disposed near both ends of the base member 12 are successively covered by the insulating film 16 and 18. In this preferred embodiment, three consecutive electrodes 14 from each end of the base member 12 are preferably covered by the insulating film 16, and two consecutive electrodes 14 from each end of the base member 12 are preferably covered by the insulating film 18. The side surfaces of the base member 12 on which the insulating film 16 and 18 are formed serve as connection sections to external electrodes, which will be described later.

In these connection sections, namely, the side surfaces of the base member 12 on which the insulating films 16 and 18 are provided, external electrodes 20 and 22 are formed. The electrode 20 connects to electrodes 14 which are not covered by the insulating film 16, and the electrode 22 connects to electrodes 14 which are not covered by the insulating film 18. In other words, two adjacent electrodes 14 are connected to the electrodes 20 and 22, respectively, except that some of the electrodes 14 disposed at the two ends of the base member 12 are not connected to the external electrodes 20 and 22.

The piezoelectric resonator 10 uses the external electrodes 20 and 22 as input and output electrodes. At the center of the base member 12, the base member 12 is piezoelectrically active because an electric field is applied between adjacent electrodes 14. The base member 12 is preferably piezoelectrically inactive at the two ends thereof because an electric field is not applied between adjacent electrodes 14 since the electrodes 14 are insulated. Therefore, an active section 24 for input signals is defined preferably at the center of the base member 12 as shown by hatching in FIG. 2. In this preferred embodiment, inactive sections 26 for input signals are also defined preferably at the two ends of the base member 12.

The piezoelectric base member 12 is preferably arranged such that a node is defined at a center or midpoint of the active section 24 thereby allowing the piezoelectric resonator 10 to be supported at the node without affecting the resonator characteristics.

Figure 3:
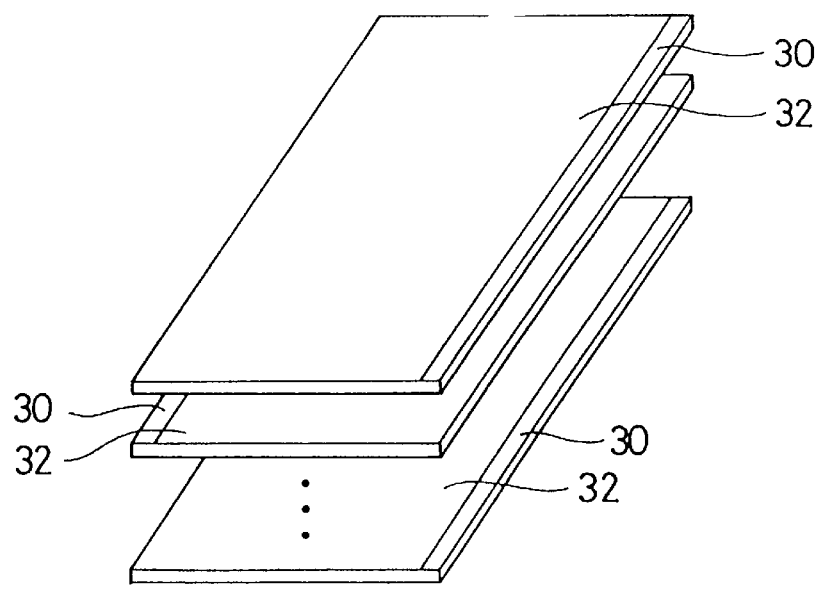
FIG. 3 is a perspective view indicating how ceramic green sheets are laminated in order to produce the piezoelectric resonator shown in FIG. 1.
Figure 4:
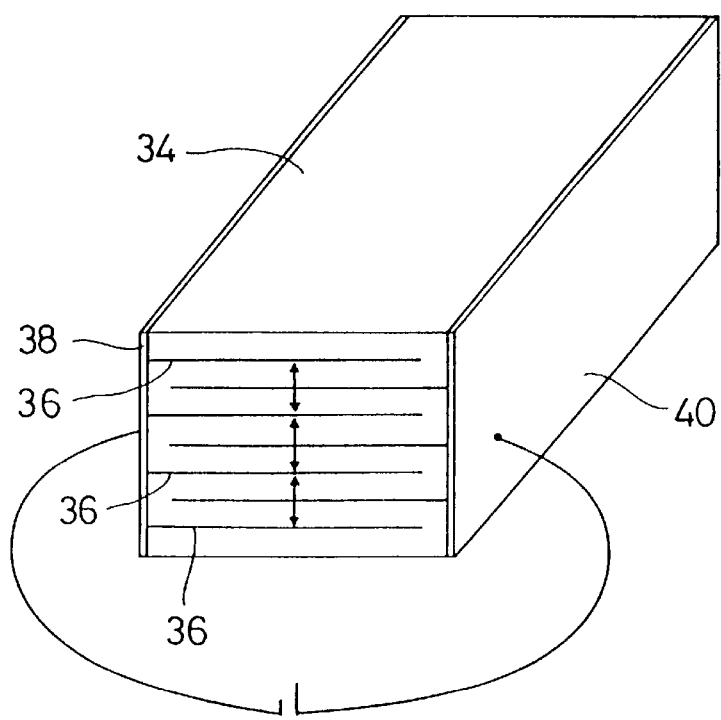
FIG. 4 is a view showing a laminated block formed by the ceramic green sheets shown in FIG. 3.

In a preferred embodiment of making the piezoelectric resonator 10, green sheets 30 made from piezoelectric ceramic are first prepared as shown in FIG. 3. On one surface of each green sheet 30, electrically conductive paste including, for example, silver, palladium, and an organic binder, is applied to form an electrically conductive paste layer 32 over almost the entire area of each green sheet 30 excluding an end portion. A plurality of green sheets 30 are laminated such that the end portions where the electrically conductive paste layers 32 are not formed on the green sheets are arranged alternately in opposite directions. The laminated member with electrically conductive paste applied to opposite side surfaces is baked to form a laminated block 34 shown in FIG. 4.

The laminated block 34 has a plurality of internal electrodes 36, which have been made by baking the electrically conductive layers 32. External electrodes 38 and 40 formed on opposite side surfaces are connected to every other internal electrode 36, respectively, since the internal electrodes 36 are alternately exposed on opposite side surfaces of the laminated block 34. When a DC voltage is applied to the external electrodes 38 and 40, the laminated block 34 is polarized. Inside the laminated block 34, a high DC electric field is applied between adjacent internal electrodes 36 alternately in opposite directions. Therefore, the laminated block 34 is polarized in the opposite directions on both sides of the internal electrodes 36 as shown by arrows in FIG. 4.

Figure 5:
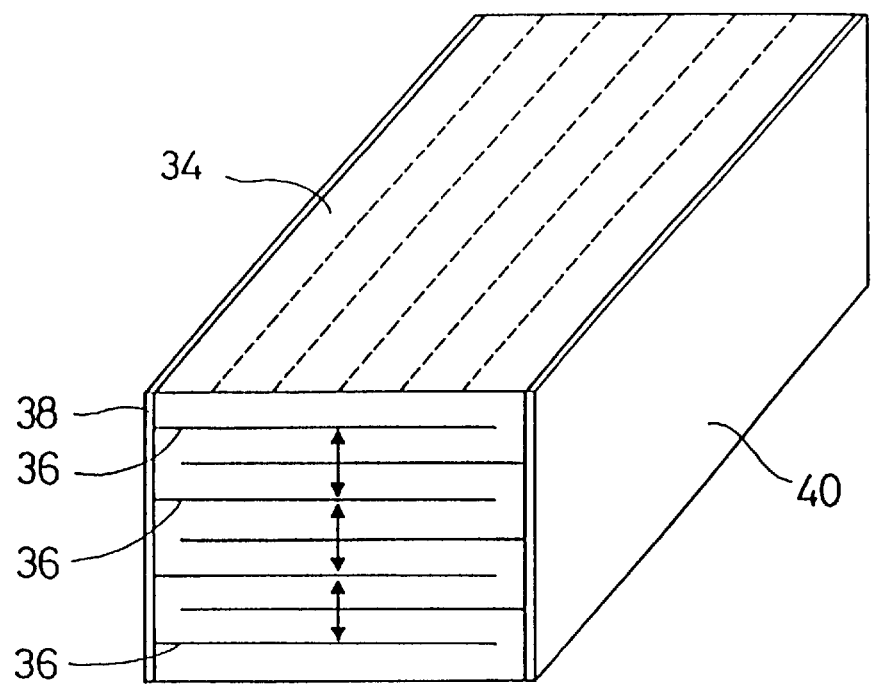
FIG. 5 is a view showing portions where the laminated block shown in FIG. 4 is cut.
Figure 6:
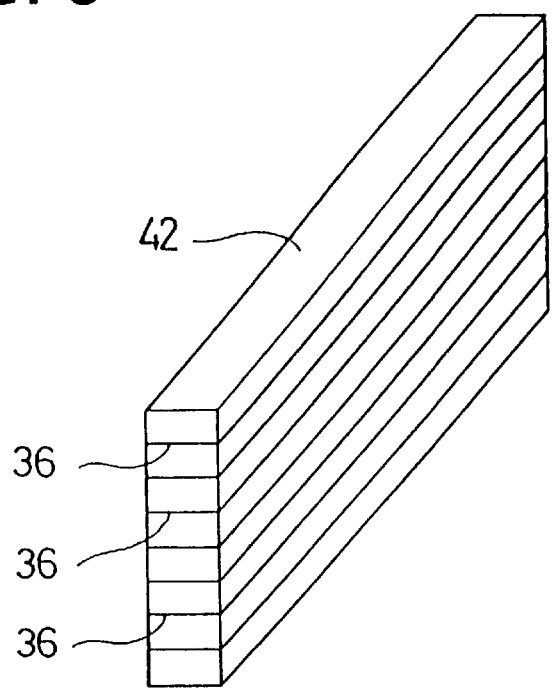
FIG. 6 is a view showing a plate-shaped block made by cutting the laminated block shown in FIG. 5.
Figure 7:
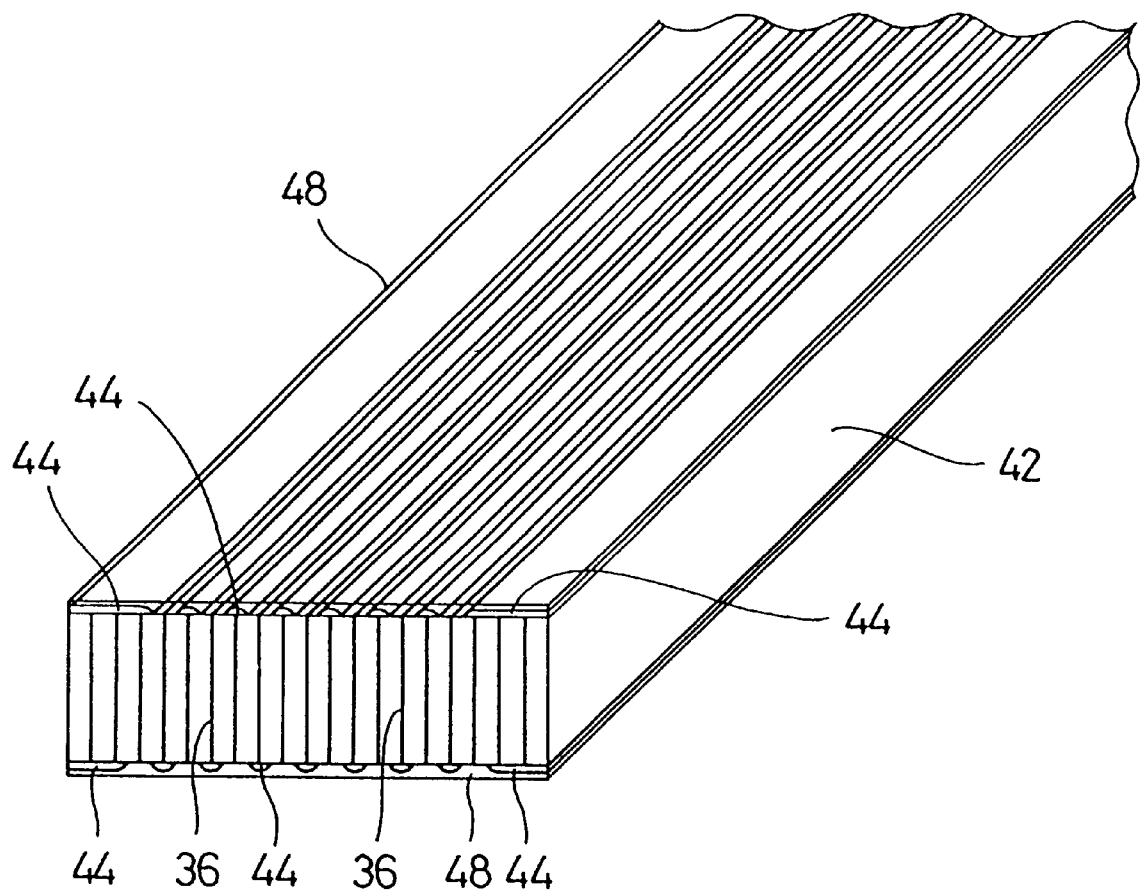
FIG. 7 is a view showing the condition in which a resin insulating material is applied to the plate-shaped block shown in FIG. 6 and external electrodes are formed.

The laminated block 34 is preferably surface-ground to the desired thickness since the anti-resonant frequency of the resonator is determined by the thickness of the laminated block 34. The laminated block 34 is cut by a dicing machine along dotted lines shown in FIG. 5 such that the cutting planes are substantially perpendicular to the plurality of internal electrodes 36. Then, a plate-shaped block 42 shown in FIG. 6 is obtained. A resin insulating material 44 is preferably applied to both surfaces of the plate-shaped block 42 as shown in FIG. 7 such that the material 44 is applied to every other internal electrode 36 on one surface and every other internal electrode 36 to which the material 44 is not applied, on the other surface. At both ends of the plate-shaped block 42, the resin insulating material 44 is applied to the internal electrodes 36 collectively. External electrodes 48 are provided on the plate-shaped block 42. Then, the resultant block is cut substantially perpendicularly to the internal electrodes 36 to form the piezoelectric resonator 10 shown in FIG. 1.

When a signal is applied to the external electrodes 20 and 22 in the piezoelectric resonator 10, since voltages are applied in directions opposite to the directions of polarization of the piezoelectric layers in the active section 24, the piezoelectric layers expand and contract in the same direction simultaneously and as an integral unit. Therefore, the piezoelectric resonator 10 as a whole vibrates in the longitudinal direction in a basic mode with the center of the base member 12 serving as a node.

In the piezoelectric resonator 10, the polarization direction of the active section 24, the applied electric field direction, and the direction of vibration in the active section 24 are all the same. In other words, the piezoelectric resonator 10 is a stiffened type resonator. The stiffened piezoelectric resonator 10 has a larger electromagnetic coupling coefficient than an unstiffened piezoelectric resonator, in which the direction of vibration differs from the direction of polarization and electric field. Therefore, the piezoelectric resonator 10 has a larger frequency difference ΔF between the resonant frequency and the anti-resonant frequency than the conventional piezoelectric resonator. This means that the piezoelectric resonator 10 achieves wide-frequency-band characteristics.

Figure 8:
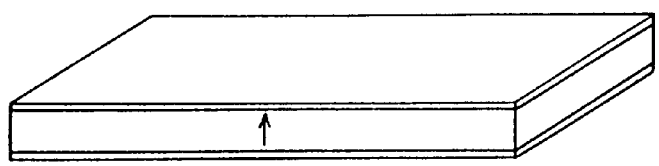
FIG. 8 is a perspective view of an unstiffened piezoelectric resonator which vibrates in the longitudinal direction, which is shown for comparison.
Figure 9:
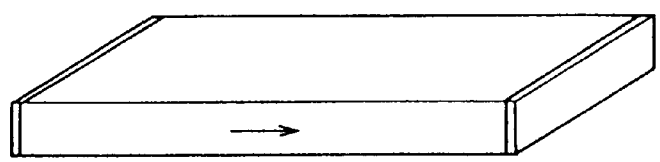
FIG. 9 is a perspective view of a stiffened piezoelectric resonator which vibrates in the longitudinal direction.
Figure 10:
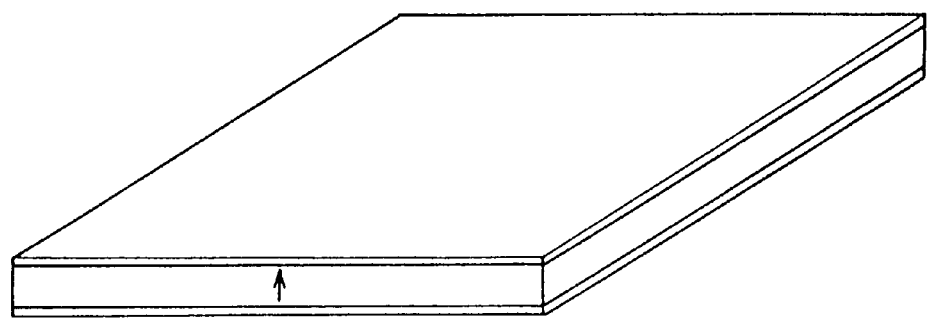
FIG. 10 is a perspective view of an unstiffened piezoelectric resonator which vibrates in the plane direction (square-type vibration), which is shown for comparison.

To measure differences between stiffened and unstiffened piezoelectric resonators, piezoelectric resonators shown in FIGS. 8, 9, and 10 were made. The piezoelectric resonator shown in FIG. 8 was made by forming electrodes on two opposite major surfaces of a piezoelectric substrate measuring approximately 4.0 mm by 1.0 mm by 0.38 mm. This piezoelectric resonator was polarized in the thickness direction and vibrated in the longitudinal direction when a signal was applied to the electrodes. The piezoelectric resonator shown in FIG. 9 had the same dimensions as the piezoelectric resonator shown in FIG. 8. Electrodes were formed on two opposite end surfaces extending along the width of a piezoelectric substrate. The piezoelectric resonator was polarized in the longitudinal direction and vibrated in the longitudinal direction when a signal was applied to the electrodes. The piezoelectric resonator shown in FIG. 10 was made by forming electrodes on two opposite major surfaces of a piezoelectric substrate measuring approximately 4.7 mm by 4.7 mm by 0.38 mm. This piezoelectric resonator was polarized in the thickness direction and vibrated in the plane direction when a signal was applied to the electrodes. The piezoelectric resonators shown in FIGS. 8 and 10 were of the unstiffened type and the piezoelectric resonator shown in FIG. 9 was of the stiffened type.

The resonant frequency Fr and the electromechanical coupling coefficient K of each of these piezoelectric resonators were measured and the results are shown in Tables 1, 2, and 3. Table 1 indicates the measured results of the piezoelectric resonator shown in FIG. 8. Table 2 indicates the measured results of the piezoelectric resonator shown in FIG. 9. Table 3 indicates the measured results of the piezoelectric resonator shown in FIG. 10.

TABLE 1

|  | Basic longitudinal vibration | longitudinal triple-wave vibration | Width-mode vibration |
| --- | --- | --- | --- |
| Resonant frequency (MHz) | 0.460 | 1.32 | 1.95 |
| Electro- mechanical coupling coefficient (%) | 18.9 | 3.9 | 25.2 |

TABLE 2

|  | Basic longitudinal vibration | longitudinal triple-wave vibration | Width-mode vibration |
| --- | --- | --- | --- |
| Resonant frequency (MHz) | 0.455 | 1.44 | 1.96 |
| Electro- mechanical coupling coefficient (%) | 42.9 | 12.2 | 4.0 |

TABLE 3

|  | Basic longitudinal vibration | Square-type triple-wave vibration | Thickness- mode vibration |
| --- | --- | --- | --- |
| Resonant frequency (MHz) | 0.458 | 1.25 | 5.65 |
| Electro- mechanical coupling coefficient (%) | 35.0 | 11.5 | 23.3 |

It is understood from the measurement data that a stiffened piezoelectric resonator has a larger electromagnetic coupling coefficient K than an unstiffened piezoelectric resonator, and therefore has a larger frequency difference ΔF between the resonant frequency and the anti-resonant frequency. The largest spurious vibration in a stiffened piezoelectric resonator is of longitudinal triple-wave type and the electromagnetic coupling coefficient K is 12.2% during vibration. During width-mode vibration, which is different from basic vibration, the electromagnetic coupling coefficient K is 4.0%. In contrast, the electromagnetic coupling coefficient K during width-mode vibration is 25.2% in an unstiffened longitudinal-vibration piezoelectric resonator. In an unstiffened square-type vibration piezoelectric resonator, the electromagnetic coupling coefficient K is as large as 23.3% during thickness-mode vibration. Therefore, it is understood that a stiffened piezoelectric resonator has smaller spurious vibrations than an unstiffened piezoelectric resonator.

In the piezoelectric resonator 10, the inactive section 26 is preferably located at two opposite ends of the base member 12. The inactive section is easily changed to adjust the resonant frequency and the difference ΔF between the resonant frequency and the anti-resonant frequency. In other words, by grinding the end surfaces in the longitudinal direction of the base member 12 or by adding mass, the band width of the piezoelectric resonator 10 can be easily adjusted.

In the piezoelectric resonator 10, the capacitance of the resonator can easily be adjusted by, for example, changing the number of layers in the active section 24 thereby changing the size of the action section. In the active section 24, piezoelectric layers and electrodes 14 are preferably alternately stacked and electrically connected in parallel. When the number of layers is changed while the total thickness of the active section 24 remains constant, the following relationship is satisfied since the thickness of one layer is inversely proportional to the number of layers:

Capacitance of resonator ∞ (the number of layers in active section/thickness of a layer) ∞ (the number of layers in active section)$^2$ wherein the symbol ∞ is defined to mean "is proportional to." Thus, the capacitance of the resonator is proportional to the square of the number of layers in the active section 24. Therefore, the number of layers in the active section 24 can be changed to adjust the capacitance of the piezoelectric resonator 10. This means that the piezoelectric resonator 10 has a large degree of freedom in capacitance design and the capacitance of the resonator 10 can be changed easily without sacrificing performance characteristics or other advantages achieved. Therefore, it is easy to achieve impedance matching with an external circuit when the piezoelectric resonator 10 is mounted on a circuit board.

In another example, electrically conductive paste including, for example, silver, palladium, and an organic binder, was applied to one surface of each green sheet 30 made from piezoelectric ceramic. A plurality of such green sheets were stacked alternately and baked integrally at about 1200° C. to form a laminated block 34 measuring about 20 mm by 30 mm by 3.9 mm. External electrodes 38 and 40 were formed by sputtering. A high DC electric field was applied between adjacent internal electrodes 36 to polarize the laminated block such that the directions of polarization in adjacent piezoelectric layers were alternately opposed. The thickness of the laminated block 34 was changed. The laminated block 34 was cut to form a plate-shaped block 42 measuring approximately 1.5 mm by 30 mm by 3.8 mm. Every other electrode 36 exposed at the side surfaces of the plate-shaped block 42 were covered by a resin insulating material 44 and a silver electrode was disposed thereon by sputtering. The resultant block was cut by a dicing machine to obtain a piezoelectric resonator 10 measuring about 1.5 mm by 1.5 mm by 3.8 mm.

Figure 11:
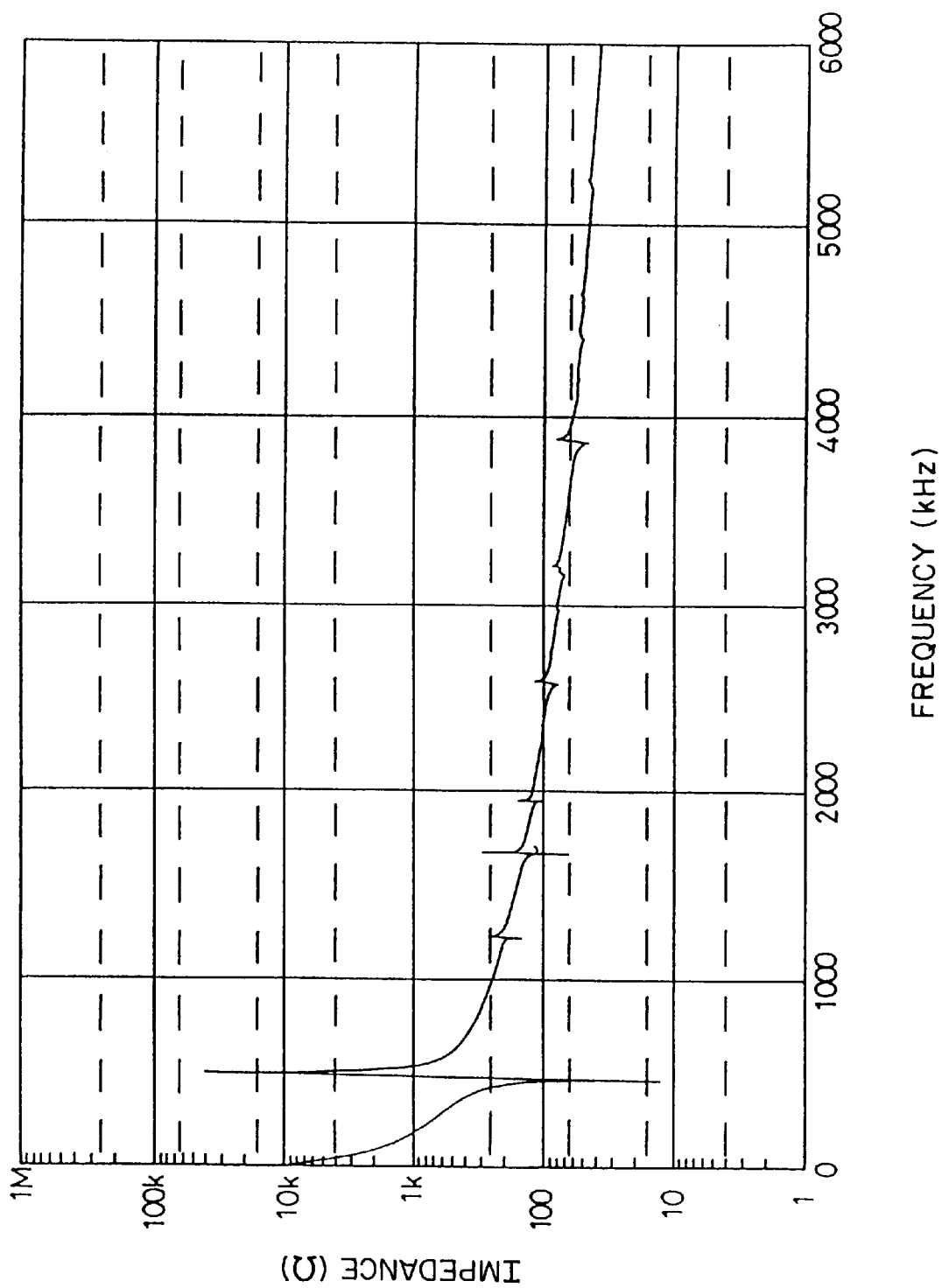
FIG. 11 is a chart showing the relationship between the frequency and the impedance of the piezoelectric resonator according to the preferred embodiments of the present invention.
Figure 12:
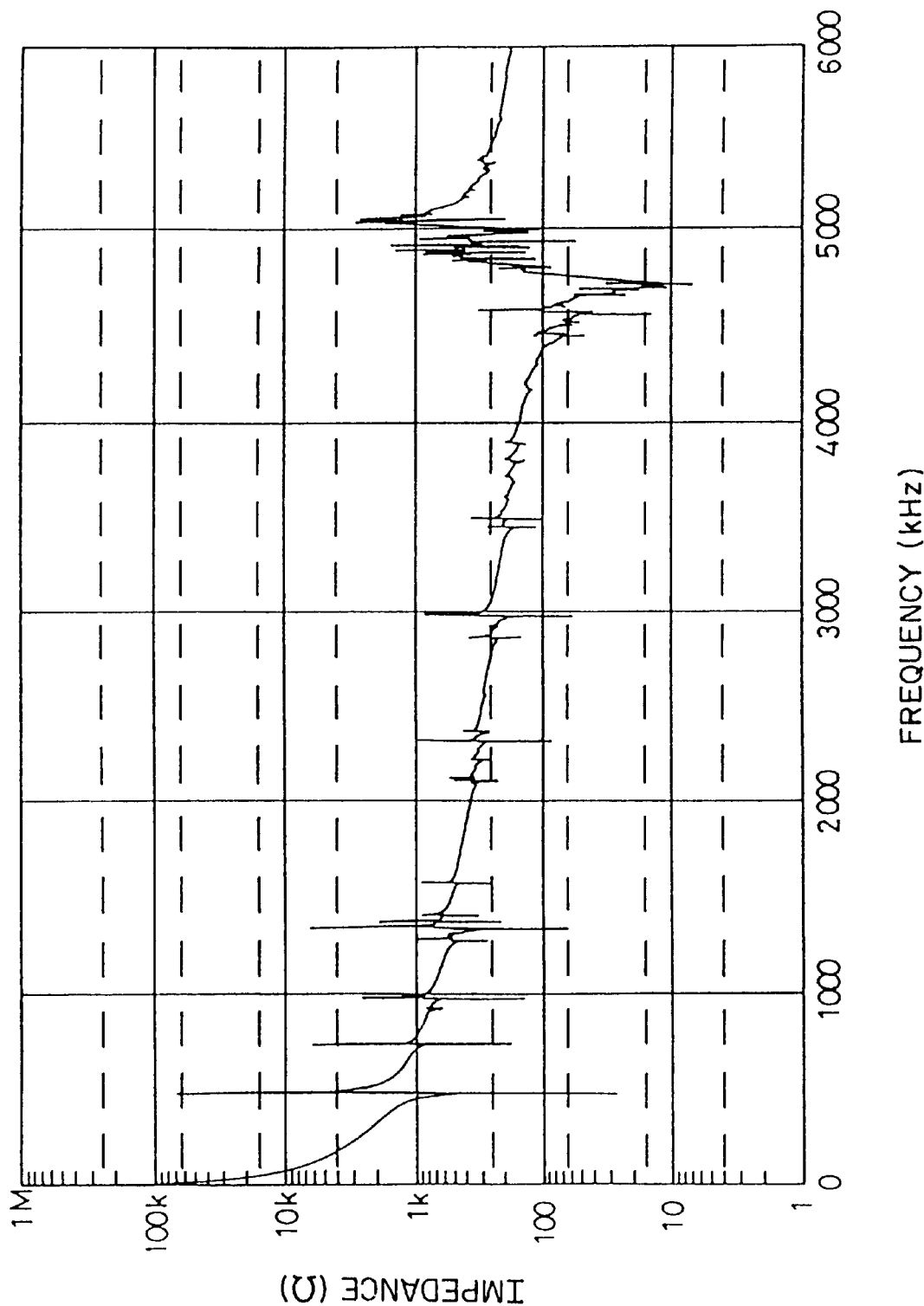
FIG. 12 is a chart showing the relationship between the frequency and the impedance of a conventional piezoelectric resonator.

The piezoelectric resonator 10 had nineteen electrodes 14 in the base member 12, the electrodes 14 being disposed at an almost equal interval of about 0.19 mm. Insulating films 16 and 18 were formed so as to avoid applying an electric field to three piezoelectric layers disposed at both ends of the base member 12. An active section 24 included 14 piezoelectric layers disposed at the center of the base member 12, and an inactive section 26 had three piezoelectric layers at the two opposite ends. The piezoelectric resonator 10 had a capacitance of 830 pF and the frequency characteristics shown in FIG. 11. For comparison, the frequency characteristics of a square-type vibration piezoelectric resonator is shown in FIG. 12. It is seen from FIGS. 11 and 12 that the piezoelectric resonator 10 according to the preferred embodiments of the present invention has much less spurious vibration than the square-shaped piezoelectric resonator.

Figure 13:
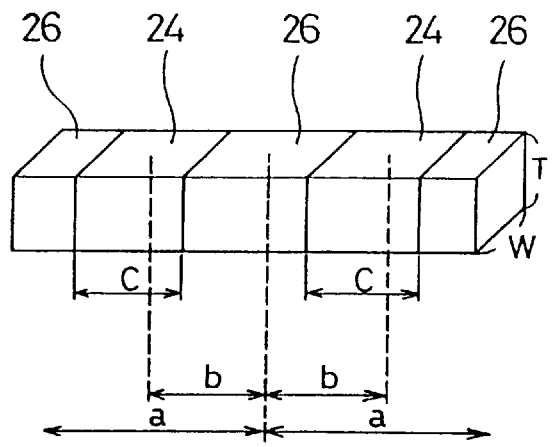
FIG. 13 is a view of a piezoelectric resonator in which the distribution of an active section and inactive sections is changed in a base member.
Figure 14:
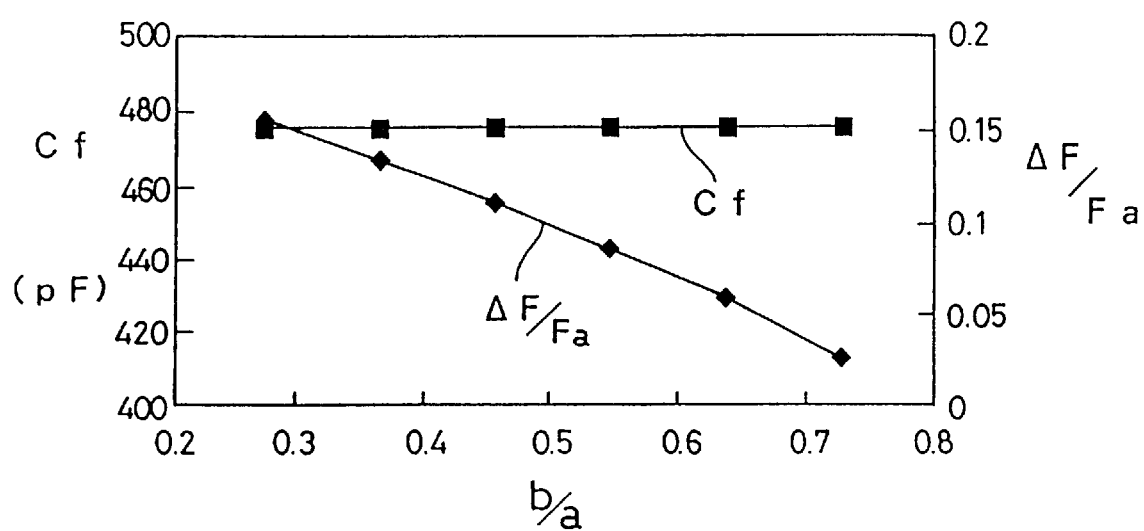
FIG. 14 is a chart indicating the relationship between the distribution of an active section and capacitance, and $\Delta F/Fa$.

Depending on the positions where the active sections 24 and inactive sections 26 are located, the frequency difference ΔF between the resonant frequency and the anti-resonant frequency changes. Inactive sections 26 can be formed, for example as shown in FIG. 13, at both ends and the center of the base member 12. The finite element method was used to calculate changes in capacitance Cf and frequency difference ΔF in the piezoelectric resonator for changing positions of the active sections, where "a" indicates the distance between the center and an end of the piezoelectric resonator 10, "b" indicates the distance between the center and the center of gravity of an active section 24, "c" indicates the length of the active sections 24, W indicates the width of the base member 12, and T indicates the thickness of the base member 12. FIG. 14 shows the relationship between b/a, and the ratio of ΔF to the anti-resonant frequency Fa, ΔF/Fa, and the capacitance Cf with "a" being equal to about 1.89 mm, W and T equal to about 0.8 mm, "c" equal to about 0.86 mm, with b/a changing. From FIG. 14, it is seen that the capacitance Cf does not change according to the changing positions of the active sections 24. In contrast, it was also found that ΔF decreases as the active sections approach the two opposite ends of the base member 12.

The frequency difference ΔF can be easily changed in the piezoelectric resonator 10 by changing the ratio of the active sections 24 to the inactive sections 26. With a changing active-section ratio, which is a ratio of the length of the active section 24 to a total length of the base member 12 in the piezoelectric resonator 10 shown in FIGS. 1 and 2, the resonant frequency Fr, the anti-resonant frequency Fa, the frequency difference ΔF, and its rate of change were measured and are indicated in Table 4 and FIG. 15.

TABLE 4

| Active-section length (mm) | Active-section ratio (%) | Fr (kHz) | Fa (kHz) | ΔF (kHz) | ΔF change rate (%) |
|---|---|---|---|---|---|
| 1.80 | 100.0 | 1047.4 | 1163.4 | 115.9 | 0.0 |
| 1.70 | 94.4 | 1042.4 | 1163.4 | 120.9 | 4.3 |
| 1.60 | 88.9 | 1038.6 | 1163.4 | 124.8 | 7.6 |
| 1.53 | 85.0 | 1036.6 | 1163.4 | 126.8 | 9.4 |
| 1.50 | 83.3 | 1035.9 | 1163.4 | 127.5 | 9.9 |
| 1.40 | 77.8 | 1034.5 | 1163.4 | 128.9 | 11.2 |
| 1.35 | 75.0 | 1034.3 | 1163.4 | 129.1 | 11.4 |
| 1.30 | 72.2 | 1034.3 | 1163.4 | 129.0 | 11.3 |
| 1.20 | 66.7 | 1035.5 | 1163.4 | 127.9 | 10.3 |
| 1.17 | 65.0 | 1036.1 | 1163.4 | 127.2 | 9.7 |
| 1.10 | 61.1 | 1038.1 | 1163.4 | 125.3 | 8.1 |
| 1.00 | 55.6 | 1042.0 | 1163.4 | 121.4 | 4.7 |
| 0.90 | 50.0 | 1047.4 | 1163.4 | 115.9 | 0.0 |
| 0.80 | 44.4 | 1054.3 | 1163.4 | 100.1 | −5.0 |
| 0.70 | 38.9 | 1062.7 | 1163.4 | 100.6 | −13.2 |
| 0.60 | 33.3 | 1072.7 | 1163.4 | 90.7 | −21.8 |

TABLE 4-continued

| Active-section length (mm) | Active-section ratio (%) | Fr (kHz) | Fa (kHz) | ΔF (kHz) | ΔF change rate (%) |
|---|---|---|---|---|---|
| 0.50 | 27.8 | 1084.2 | 1163.4 | 79.1 | −31.7 |
| 0.40 | 22.2 | 1097.3 | 1163.4 | 66.1 | −43.0 |
| 0.30 | 16.7 | 1111.9 | 1163.4 | 51.5 | −55.6 |
| 0.20 | 11.1 | 1127.9 | 1163.4 | 35.5 | −69.4 |
| 0.10 | 5.6 | 1145.2 | 1163.4 | 18.2 | −84.3 |

Figure 15:
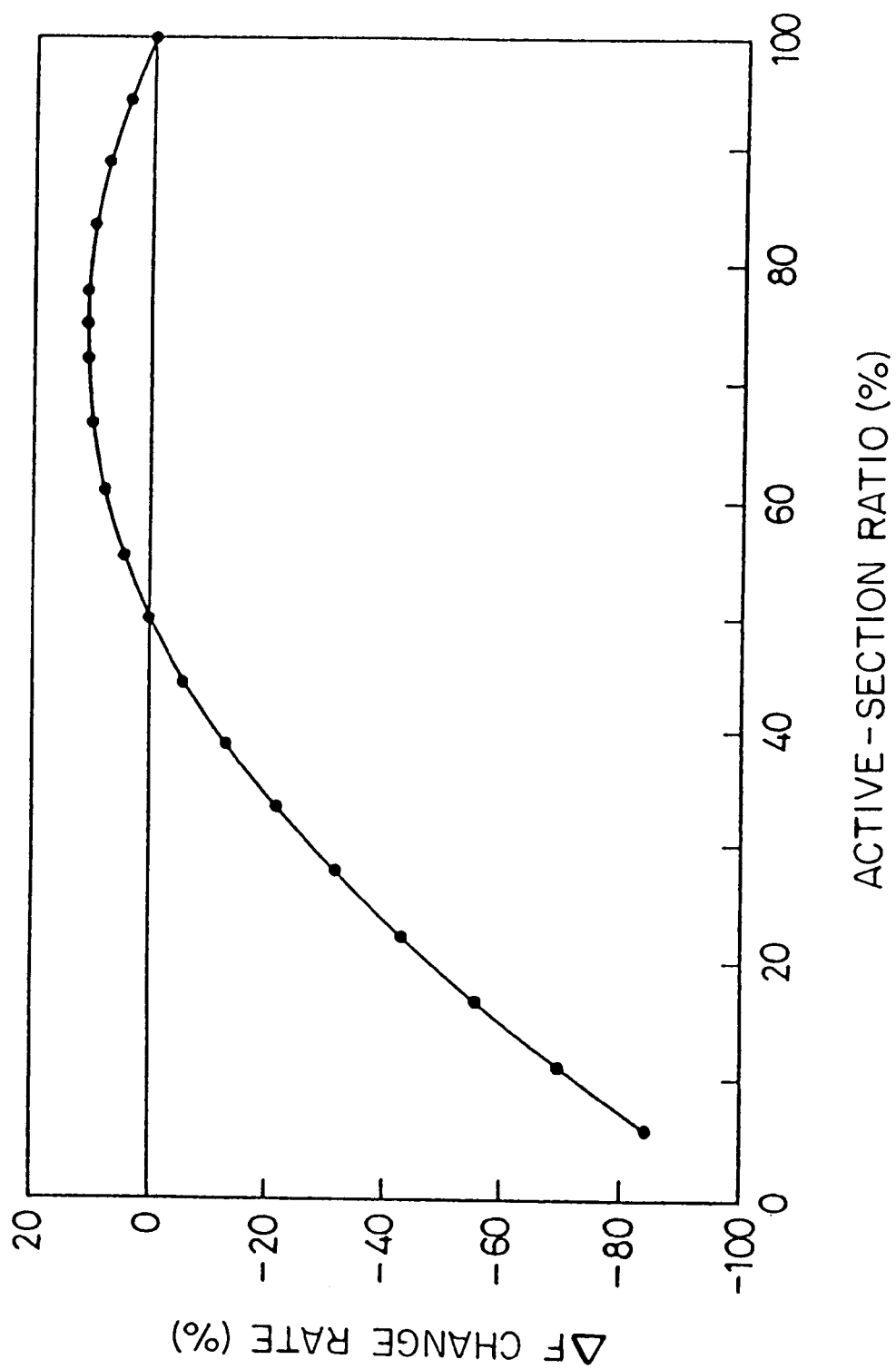
FIG. 15 is a chart showing the relationship between an active-section ratio and $\Delta F$.

FIG. 15 shows the relationship between the active-section ratio and change in ΔF under the condition in which ΔF is set to 100% when the active-section ratio is 100%, namely when an inactive section does not exist. It is seen from FIG. 15 that ΔF is large at an active-section ratio of 65% to 85% with the peak ΔF being obtained at an active-section ratio of 75%. The peak value is larger by about 10% than the ΔF obtained when the active-section ratio is 100%, in other words, when an inactive section does not exist. The same ΔF is obtained at active-section ratios of 50% and 100%. Therefore, to obtain a piezoelectric resonator having a large ΔF, the active-section ratio should be set substantially equal to about 50%.

In the piezoelectric resonator 10, when 14 piezoelectric layers constituted the active section 24 among 20 layers, the capacitance was 830 pF. In contrast, when the active-section ratio was set to 100%, which means that only one piezoelectric layer was used, in other words, when electrodes were formed at the two opposite end surfaces of the base member 12, with the same material and the same dimensions, the capacitance was 3.0 pF. When all of the 24 piezoelectric layers constituted the active section 24, the capacitance was 1185.6 pF. By changing the number of layers in the piezoelectric resonator 10, the capacitance can be changed within a range of about 400-times difference between the minimum and maximum. Therefore, by changing the lamination structure of the piezoelectric resonator 10, the capacitance can be selected from a wide range which provides a large degree of freedom in capacitance design.

Figure 16:
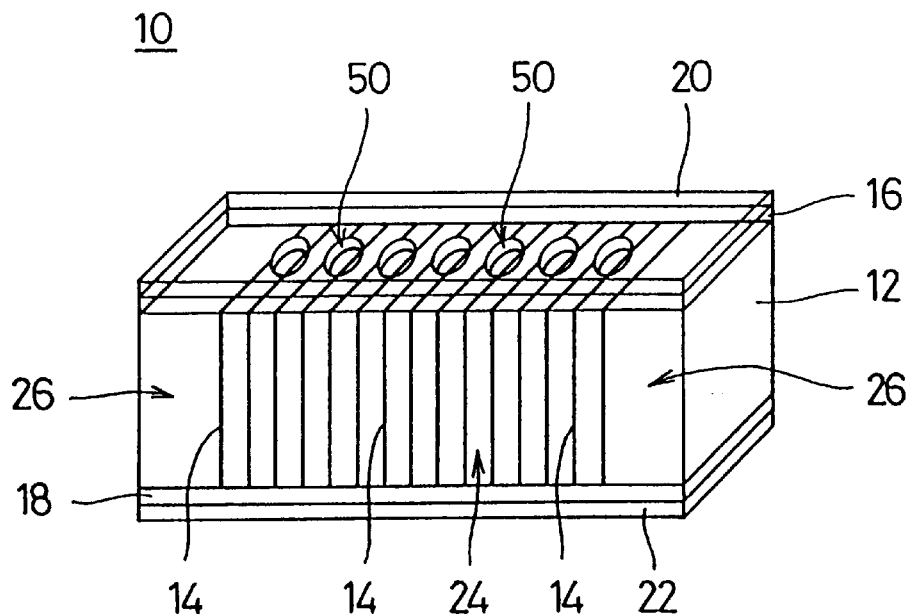
FIG. 16 is a view showing a modified piezoelectric resonator according to the preferred embodiments of the present invention.
Figure 17:
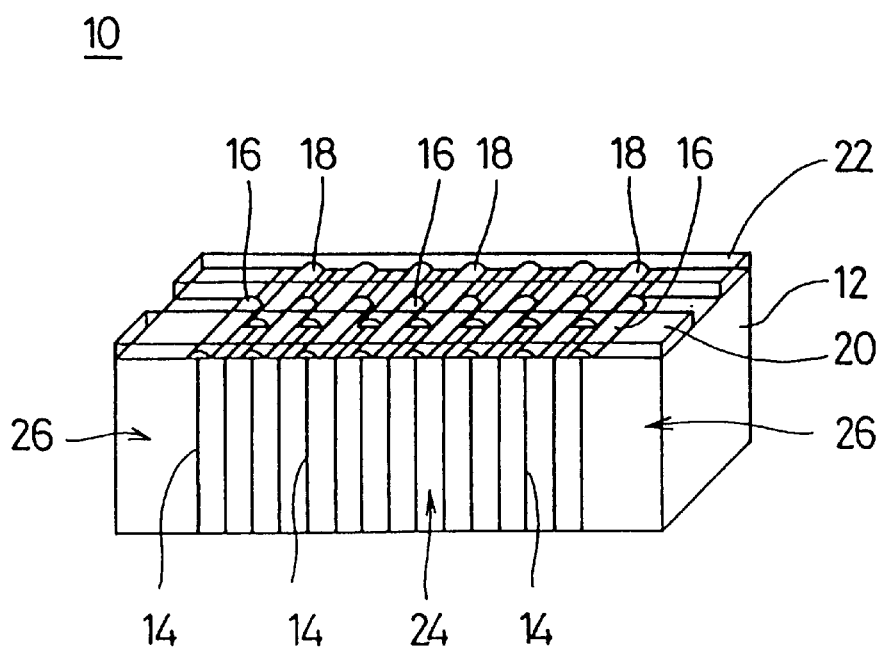
FIG. 17 is a view showing another modified piezoelectric resonator according to the preferred embodiments of the present invention.

In order to connect the electrodes 14 formed inside the base member 12 to the external electrodes 20 and 22, insulating film 16 and 18 having windows 50 may be provided such that every other electrode 14 is exposed as shown in FIG. 16. The external electrodes 20 and 22 are formed on the insulating film 16 and 18, and the electrodes 14 alternately connect to the two external electrodes 20 and 22. Two external electrodes 20 and 22 may be formed on one side surface of the base member 12 as shown in FIG. 17. Insulating films 16 and 18 are formed on one side surface of the base member 12 in a two-row manner and two rows of connection sections are formed. These two rows of insulating film 16 and 18 are formed respectively on every other electrode 14. On these two rows of insulating film 16 and 18, two rows of external electrodes 20 and 22 are formed, respectively. The piezoelectric resonators having these modifications can achieve the same advantages as the above-described piezoelectric resonator.

Figure 18:
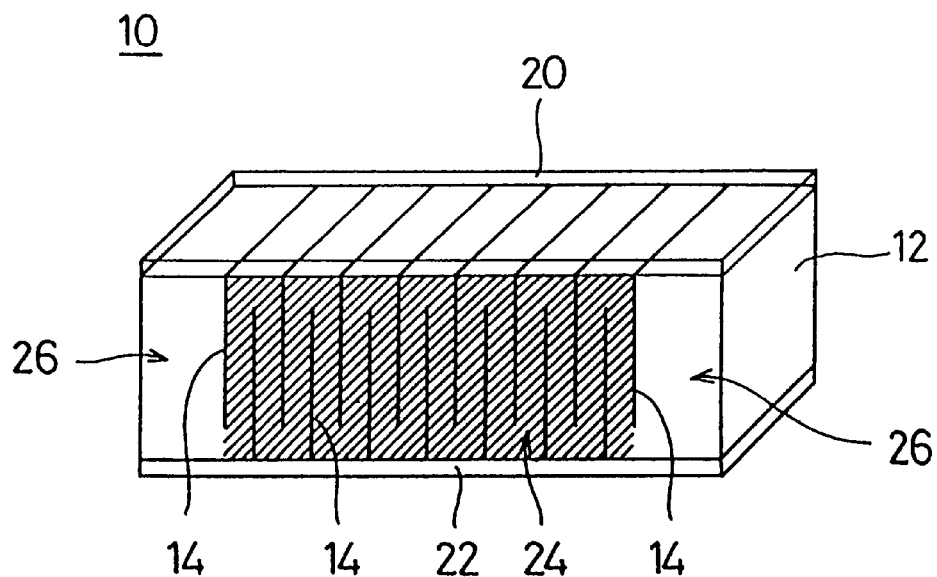
FIG. 18 is a view showing still another piezoelectric resonator according to the preferred embodiments of the present invention.
Figure 19:
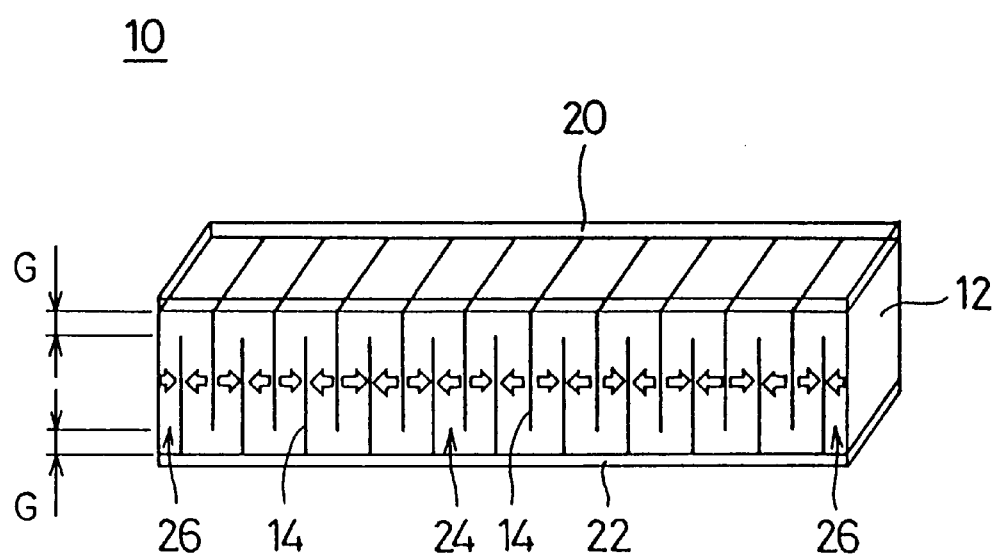
FIG. 19 is a view indicating the gap between the end of an internal electrode and a side surface of a base member in the piezoelectric resonator shown in FIG. 18.

Internal electrodes 14 may alternately extend to the opposite side surfaces of the base member 12 as shown in FIG. 18. On the opposite side surfaces of the base member 12, it is necessary to form external electrodes 20 and 22. In such a piezoelectric resonator 10, since the electrodes 14 formed inside are exposed alternately, the internal electrodes 14 are connected to the external electrodes 20 and 22 by forming the external electrodes 20 and 22 on the side surfaces of the base member 12. Therefore, there is no need to provide insulating film on the side surfaces of the base member 12.

Figure 20:
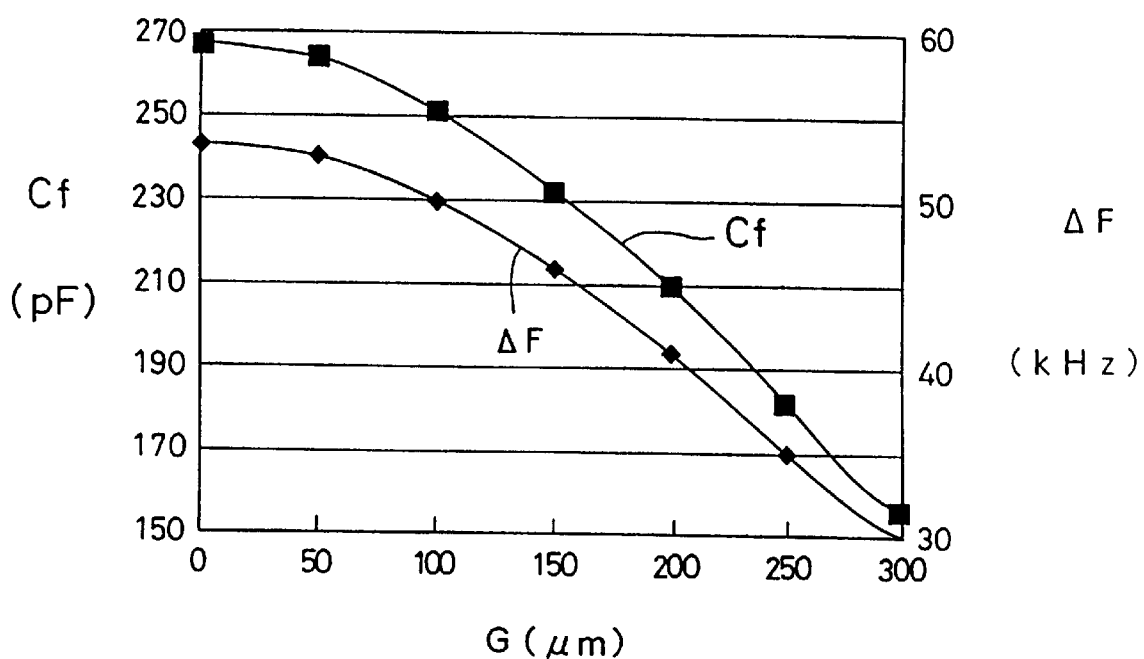
FIG. 20 is a chart indicating the relationships between the capacitance and $\Delta F$, and the gap between an internal electrode and a side surface of the base member.

An electrode 14 is preferably formed to not cover an entire area of a cross section of the base member 12 in this piezoelectric resonator 10. Therefore, the opposing area of adjacent electrodes 14 is smaller than that of adjacent electrodes 14 formed so as to cover the entire cross section. By using the opposing area, the capacitance and ΔF of the piezoelectric resonator 10 can be adjusted. Using the finite element method, with the gap G between the end of an electrode 14 and the side surface of the base member 12 in the thickness direction being changed, the anti-resonant frequency Fa, capacitance Cf, and ΔF of a piezoelectric resonator having a base member 12 which is about 3.74 mm long, about 0.8 mm wide, about 1.0 mm thick, and having an active section 24 about 3.6 mm long, inactive sections 26 disposed at two opposite ends 0.07 mm long and 20 piezoelectric layers each about 0.18 mm thick were calculated. The results are shown in Table 5 and FIG. 20. It is seen from Table 5 and FIG. 20 that Cf and ΔF become smaller as the gap G increases, in other words, as the opposite area of the electrodes 14 becomes smaller.

| Gap G (μm) | Fa (kHz) | Fa change rate (%) | Cf (pF) | Cf change rate (%) | ΔF (kHz) | ΔF change rate (%) |
|---|---|---|---|---|---|---|
| 1 | 546.37 | −0.52 | 267.58 | 27.47 | 53.36 | 30.15 |
| 50 | 546.75 | −0.45 | 264.40 | 25.96 | 52.71 | 28.56 |
| 100 | 547.38 | −0.33 | 251.69 | 19.90 | 50.05 | 22.07 |
| 150 | 548.20 | −0.18 | 232.38 | 10.70 | 45.89 | 11.93 |
| 200 | 549.20 | 0.00 | 209.91 | 0.00 | 41.00 | 0.00 |
| 250 | 550.61 | 0.26 | 181.96 | −13.32 | 35.06 | −14.49 |
| 300 | 552.11 | 0.53 | 156.44 | −25.47 | 29.75 | −27.44 |

Figure 21:
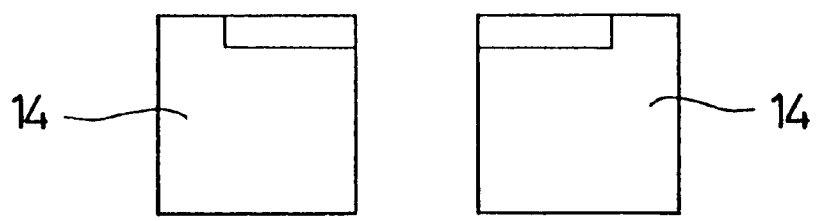
FIG. 21 is a view showing modified piezoelectric layers of the piezoelectric resonator shown in FIG. 18.
Figure 22:
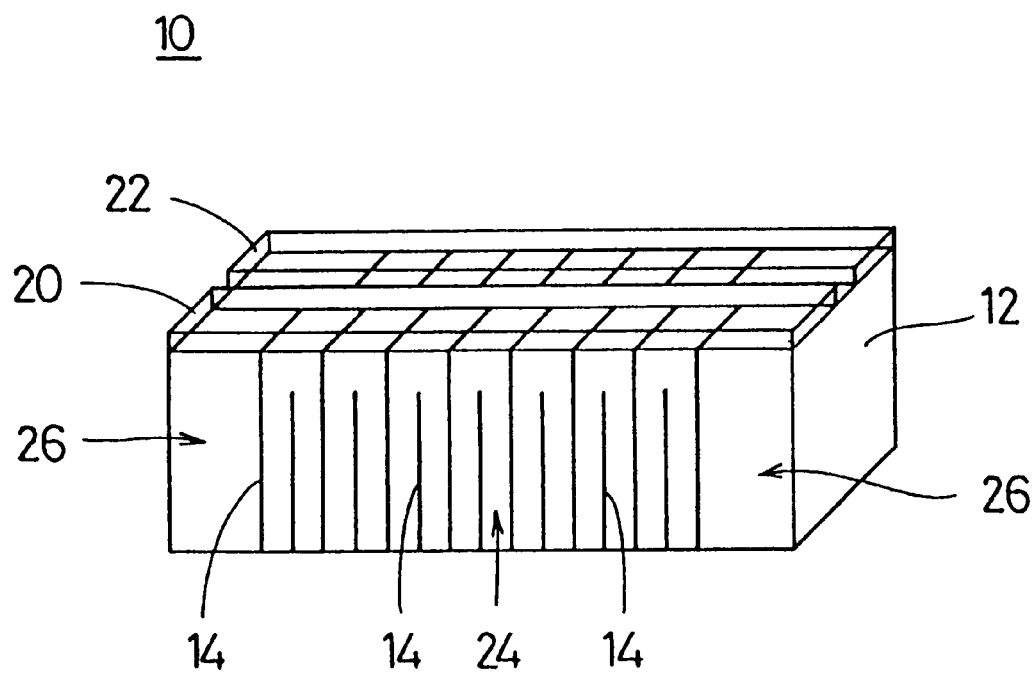
FIG. 22 is a view showing a piezoelectric resonator having the piezoelectric layers shown in FIG. 21.

Electrodes 14 may be formed such that they extend to different end surfaces on the same side of piezoelectric layers as shown in FIG. 21 in a piezoelectric resonator 10 which is a modified example of the above-described piezoelectric resonator 10. By laminating these two types of piezoelectric layers, two rows of electrodes 14 are exposed on one side surface of the base member 12 as shown in FIG. 22. Therefore, by forming external electrodes 20 and 22 at portions where the electrodes 14 are exposed, the electrodes 14 are alternately connected to the external electrodes 20 and 22.

In the piezoelectric resonator 10 in which each electrode 14 is formed to cover an the entire cross section of the base member 12 as shown in FIG. 2, since an electric field is applied to the entire cross section of the base member 12, the electromagnetic coupling coefficient of the resonator is large and thus ΔF is large. The capacitance of the piezoelectric resonator 10 is also large. When the laminated block is cut to produce a plurality of the piezoelectric resonators 10, since each electrode has been formed to cover almost the entire cross section of the laminated block in advance, each piezoelectric resonator has an electrode covering the entire cross section even if the cut position shifts. Therefore, it is not necessary to precisely determine the positions at which the laminated block is cut. By changing the direction of cutting, resonators having different cross sections, different areas, and different capacitances are obtained from the same piezoelectric, ceramic, laminated block. Resonators having various capacitances and various ΔF can be obtained according to which electrode end section has insulating film. As described above, many types of piezoelectric resonators can be obtained from the same laminated block.

In contrast, to produce a piezoelectric resonator having a gap between the ends of each internal electrode and the side surface of a base member as shown in FIG. 18, it is necessary to cut a laminated block at positions where electrodes are not formed. In such a piezoelectric resonator, however, it is not necessary to form an insulating film on a side surface of a base member, and the number of steps in the manufacturing process can be reduced.

Figure 23:
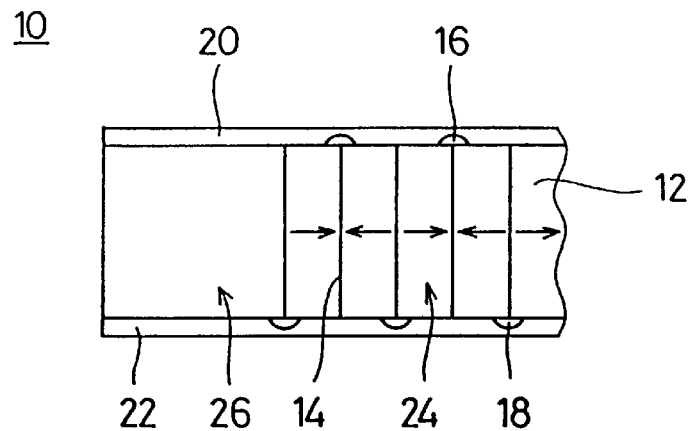
FIG. 23 is a view showing a modified inactive section of a piezoelectric resonator.
Figure 24:
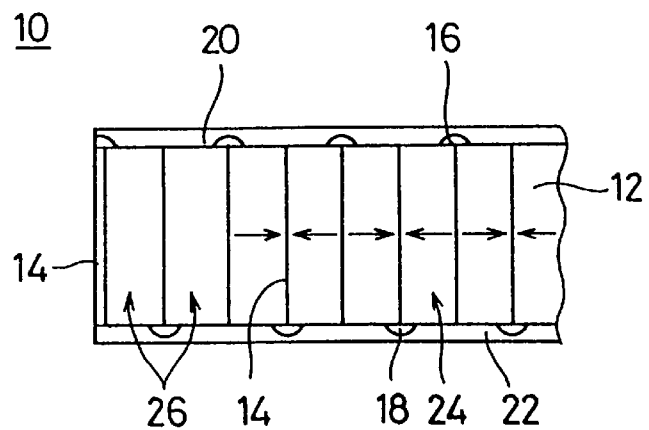
FIG. 24 is a view showing another modified inactive section of a piezoelectric resonator.
Figure 25:
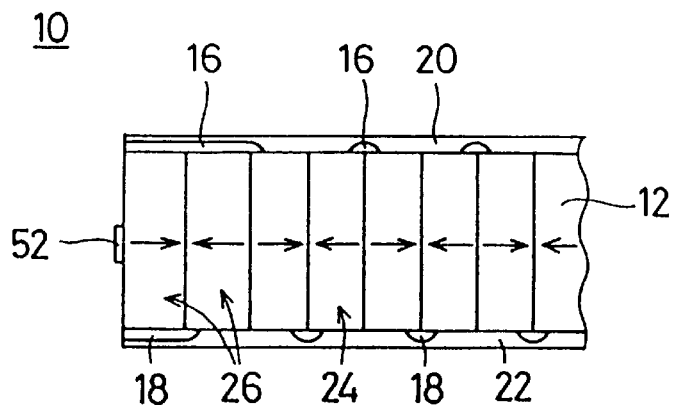
FIG. 25 is a view showing an electrode formed at an end of a base member.

An inactive section 26 may be formed such that an electric field is not applied by not providing electrodes 14 at an end of the base member 12 as shown in FIG. 23. The end of the base member 12 may be polarized or may not be polarized. As shown in FIG. 24, it is possible for only the end of the base member 12 to not be polarized. In this case, even if an electric field is applied between the electrodes 14, a portion which is not polarized is piezoelectrically inactive. In other words, only when a piezoelectric layer is polarized and an electric field is applied, does the layer become piezoelectrically active, otherwise it is inactive. In this configuration, the capacitor is located in the inactive section, and the capacitance can be increased. A small electrode 52 may be formed on an end surface of the base member 12 as shown in FIG. 25 in order to adjust the frequency or to connect to an external circuit.

Figure 26:
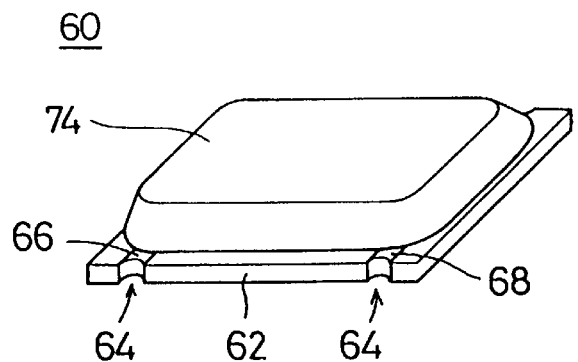
FIG. 26 is a perspective view of an electronic component using the above-described piezoelectric resonator.
Figure 27:
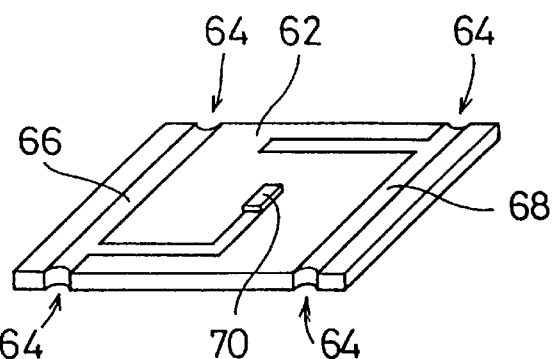
FIG. 27 is a perspective view of an insulating substrate used in the electronic component shown in FIG. 26.

Using such a piezoelectric resonator 10, electronic components such as oscillators and discriminators can be produced. FIG. 26 is a perspective view of an electronic component 60. The electronic component 60 includes an insulating substrate 62. At opposing end portions of the insulating substrate 62, two indentations 64 are preferably formed, respectively. On one surface of the insulating substrate 62, two pattern electrodes 66 and 68 are formed as shown in FIG. 27. One pattern electrode 66 is formed between opposing indentations and extends in an L-shaped manner from a point near one end toward the center of the insulating substrate 62. The other pattern electrode 68 is formed between opposing indentations 64 and extends in substantially a straight line from a point near the other end toward the center of the insulating substrate 62. The pattern electrodes 66 and 68 are formed such that they are routed in a roundabout fashion from the ends of the insulating substrate 62 to the opposite ends.

Figure 28:
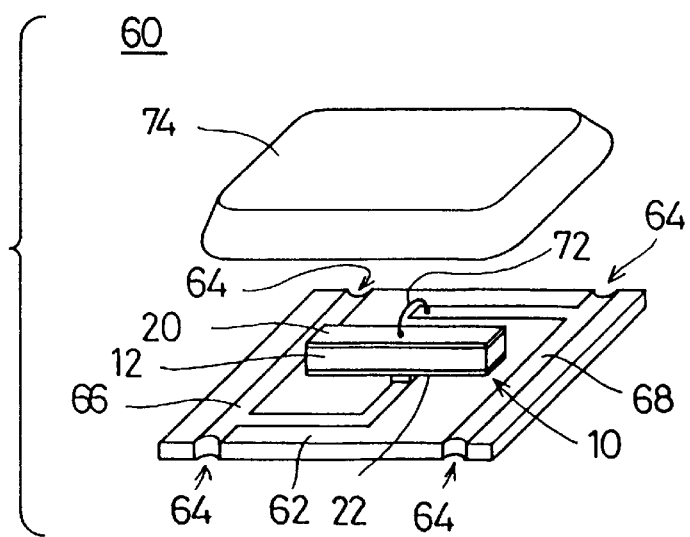
FIG. 28 is an exploded perspective view of the electronic component shown in FIG. 26.

At one end of the pattern electrode 66 disposed at the center of the insulating substrate 62, a protrusion 70 is formed with electrically conductive adhesive. As shown in FIG. 28, the above-described piezoelectric resonator 10 is mounted on the protrusion 70 such that the approximate center of the base member 12 is disposed on the protrusion 70. As described above, the piezoelectric resonator 10 is preferably arranged to have a node point located at a center or midpoint of the resonator. The resonator 10 is preferably mounted on the protrusion 70 such that the protrusion 70 is in contact with the node point of the piezoelectric resonator 10 to allow the resonator 10 to vibrate without being hindered and without affecting the resonator characteristics.

An external electrode 22 of the piezoelectric resonator 10 is, for example, connected to the protrusion 70. The other external electrode 20 is connected to a pattern electrode 68 with electrically conductive wire 72. The electrically conductive wire 72 is connected to the center of the external electrode 20 of the piezoelectric resonator 10.

A metal cap 74 is placed on the insulating substrate 62 to complete the electronic component 60. To prevent the metal cap 74 from being short-circuited to the pattern electrodes 66 and 68, insulating resin is preferably applied to the insulating substrate 62 and the pattern electrodes 66 and 68 in advance. The electronic component 60 uses the pattern electrodes 66 and 68, which are formed such that they are routed to the rear surface from ends of the insulating substrate 62, as input and output terminals for connecting to external circuits.

Since the center of the piezoelectric resonator 10 is connected to the protrusion 70 in this electronic component 60, the ends of the piezoelectric resonator 10 are disposed separately from the insulating substrate 62 so vibration is not prevented. Excited longitudinal vibration is not weakened because the center of the piezoelectric resonator, which serves as a node, is secured to the protrusion 70 and is connected to the electrically conductive wire 72.

The electronic component 60 is preferably mounted on a circuit board together with IC chips and other components to form an oscillator and a discriminator. Since the electronic component 60 is sealed and protected by the metal cap 74, it can be used as a chip-type surface-mountable component which can be mounted by reflow soldering or other suitable methods.

When the electronic component 60 is used in an oscillator, spurious vibrations are suppressed to a low level and unusual vibration caused by the spurious vibrations are prevented due to the features of the novel piezoelectric resonator 10 according to the preferred embodiments of the present invention used in the electronic component 60. It is also easy to achieve impedance matching with an external circuit since the capacitance of the piezoelectric resonator 10 can be set to any desired value. Especially when the electronic component is used for an oscillator for voltage-controlled oscillation, a wide frequency range which cannot be obtained conventionally is achieved as a result of a large $\Delta F$ of the resonator.

When the electronic component 60 is used for a discriminator, a wide peak-separation range is provided by the large $\Delta F$ of the resonator. In addition, since the resonator provides a wide capacitance range, it is easy to achieve impedance matching with an external circuit.

Figure 29:
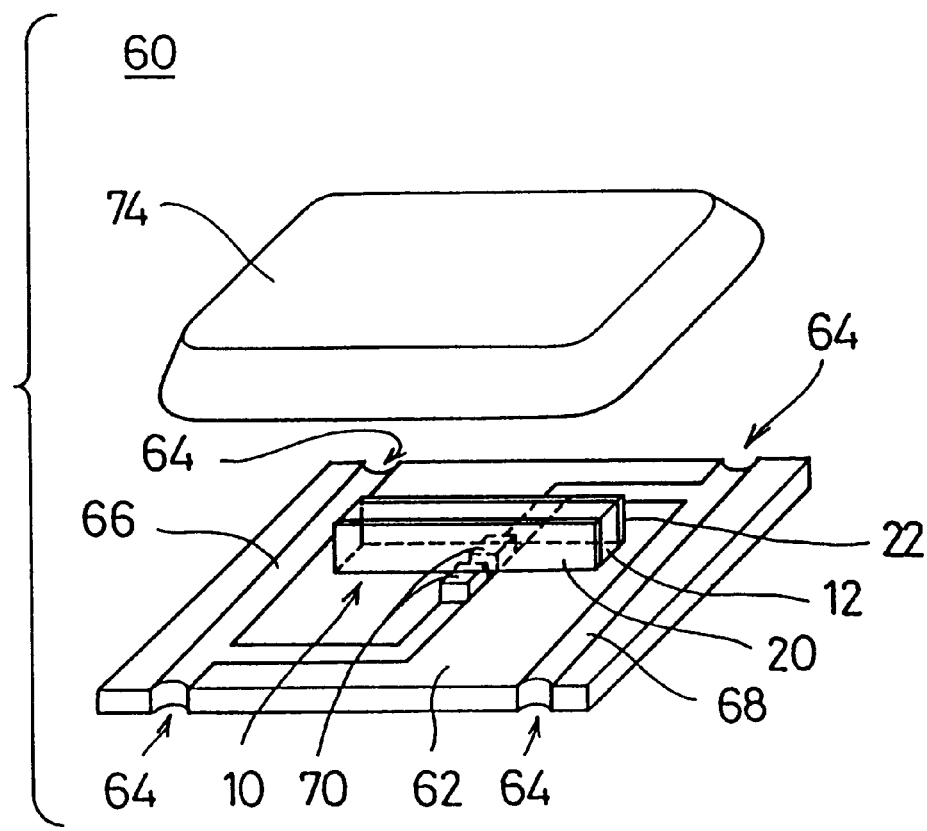
FIG. 29 is a view indicating another method for mounting the piezoelectric resonator to the insulating substrate.
Figure 30:
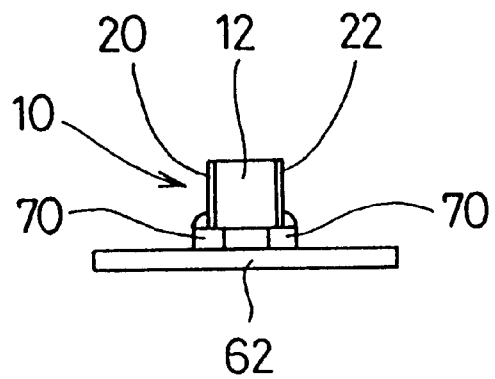
FIG. 30 is a side view showing the method for mounting the piezoelectric resonator, shown in FIG. 29.
Figure 31:
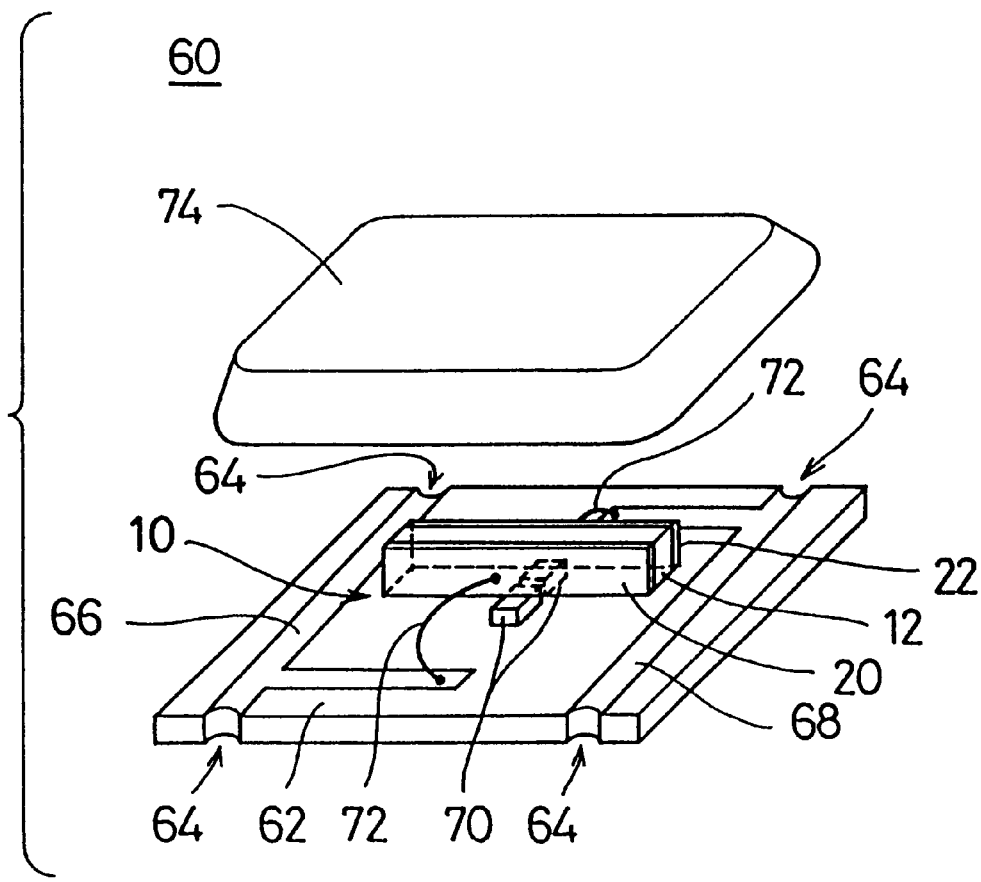
FIG. 31 is a view indicating still another method for mounting the piezoelectric resonator to the insulating substrate.
Figure 32:
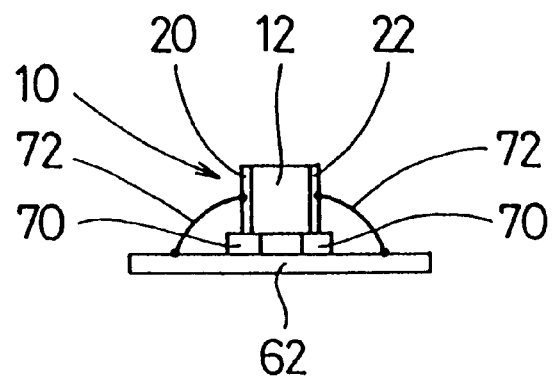
FIG. 32 is a side view showing the method for mounting the piezoelectric resonator, shown in FIG. 31.

The piezoelectric resonator 10 may be mounted on the insulating substrate 62 so that two protrusions 70 made from an electrically conductive material such as electrically conductive adhesive are formed on both pattern electrodes 66 and 68, and the external electrodes 20 and 22 of the piezoelectric resonator 10 are connected to the two protrusions 70, as shown in FIGS. 29 and 30. The piezoelectric resonator 10 may also be mounted on the insulating substrate 62 in a way shown in FIGS. 31 and 32 in which two protrusions 70 made from an insulating material such as insulating adhesive are formed on the insulating substrate 62 and the external electrodes 20 and 22 are connected to the pattern electrodes 66 and 68 with electrically conductive wire 72.

Figure 33:
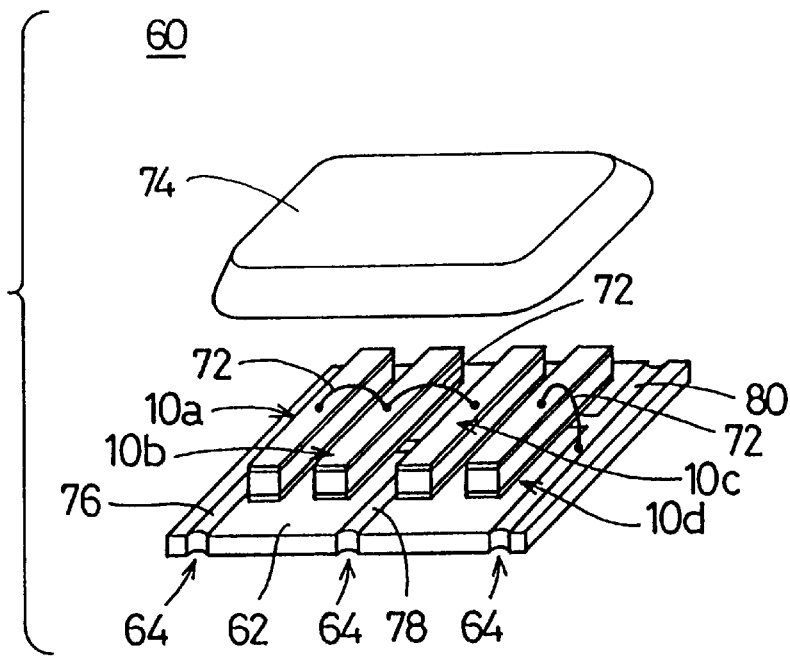
FIG. 33 is an exploded perspective view of a ladder filter using the piezoelectric resonators according to the preferred embodiments of the present invention.
Figure 34:
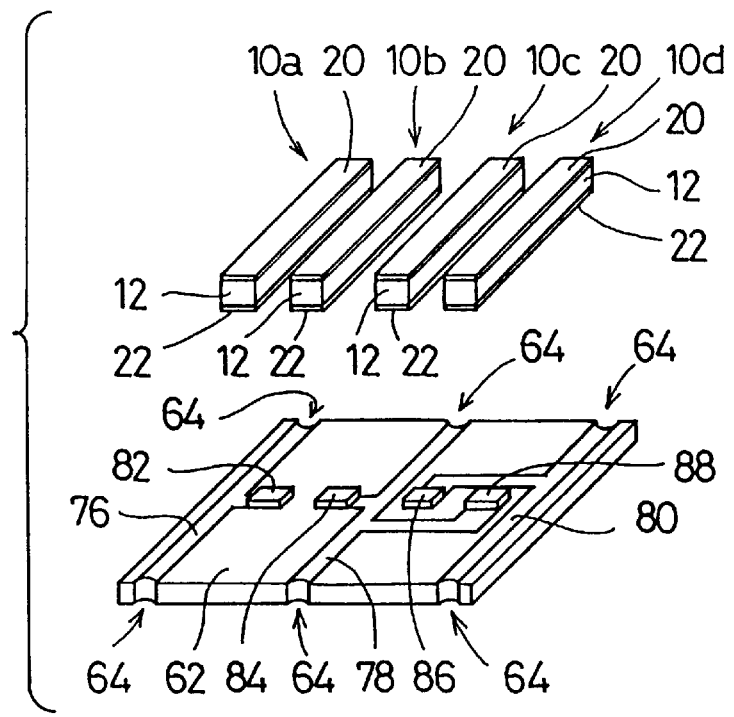
FIG. 34 is a perspective view of an insulating substrate and the piezoelectric resonators in the ladder filter shown in FIG. 33.

A ladder filter can be made using a plurality of the piezoelectric resonators 10. As shown in FIGS. 33 and 34, three pattern electrodes 76, 78, and 80 are formed on an insulating substrate 62 in this electronic component 60. Protrusions 82 and 86 are formed with electrically conductive adhesive on both-end pattern electrodes 76 and 80. On the center pattern electrode 78, two protrusions 84 and 88 are formed with electrically conductive adhesive.

One external electrode 22 for each of piezoelectric resonators 10a, 10b, 10c, and 10d is mounted to each of the protrusions 82, 84, 86, and 88, respectively. The resonators 10a–10d are preferably mounted on the respective protrusions 82, 84, 86 and 88 at respective node points on each of the resonators 10a–10d. The other external electrodes 20 for piezoelectric resonators 10a, 10b, and 10c are connected to each other with electrically conductive wire 72. The other external electrode 20 of a piezoelectric resonator 10d is connected to the pattern electrode 80 with electrically conductive wire 72. A metal cap 74 is placed on the insulating substrate 62.

Figure 35:
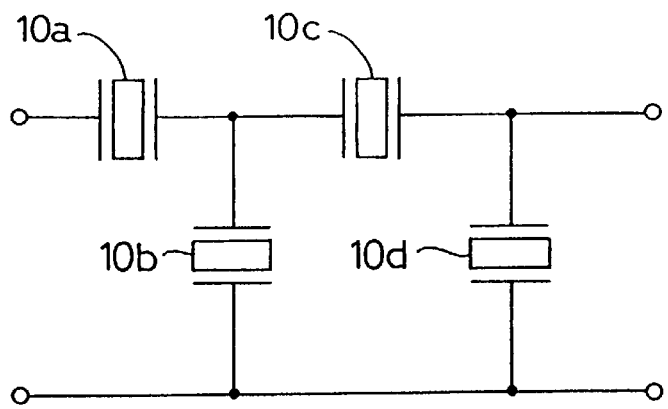
FIG. 35 is an equivalent circuit diagram of the ladder filter shown in FIG. 33.

The electronic component 60 is used as a ladder filter having a ladder-shaped circuit shown in FIG. 35. Two piezoelectric resonators 10a and 10c serve as series resonators and the other two piezoelectric resonator 10b and 10d serve as parallel resonators. In such a ladder filter, the parallel piezoelectric resonators 10b and 10d are designed to have substantially larger capacitances than the series piezoelectric resonators 10a and 10c.

Attenuation in the ladder filter is determined by the capacitance ratio between the series resonators and the parallel resonators. In this electronic component 60, the capacitance can be adjusted by changing the number of laminated layers used in the piezoelectric resonators 10a to 10d. Therefore, a ladder filter having a larger attenuation with fewer resonators is implemented by changing the capacitances of the piezoelectric resonators, as compared with a case where the conventional unstiffened piezoelectric resonators are used. Since the piezoelectric resonators 10a to 10d have a larger $\Delta F$ than the conventional piezoelectric resonator, a wider transmission frequency band is implemented as compared with the conventional piezoelectric resonator.

Figure 36:
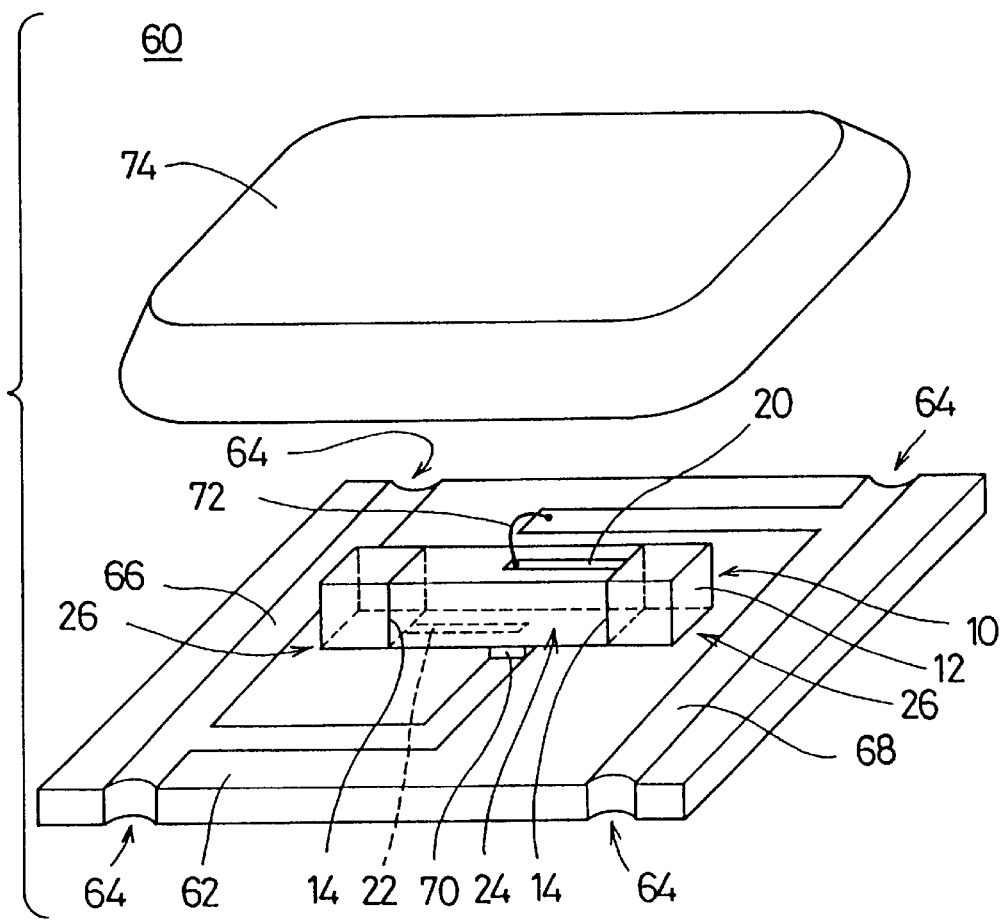
FIG. 36 is a view showing an electronic component in which a piezoelectric resonator having different-shaped external electrodes is mounted on an insulating substrate.

FIG. 36 shows such an electronic component 60 in which two electrodes 14 are formed inside the base member 12 of the piezoelectric resonator 10. The inactive sections 26 preferably occupy about 25% (12.5% each) of the base member 12 in length. External electrodes 20 and 22 are arranged such that they extend from the internal electrodes 14 to the approximate centers of side surfaces of the base member 12, respectively. The shapes of the external electrodes 20 and 22 are adjusted according to the number of the internal electrodes 14 and their forming conditions.

Figure 37:
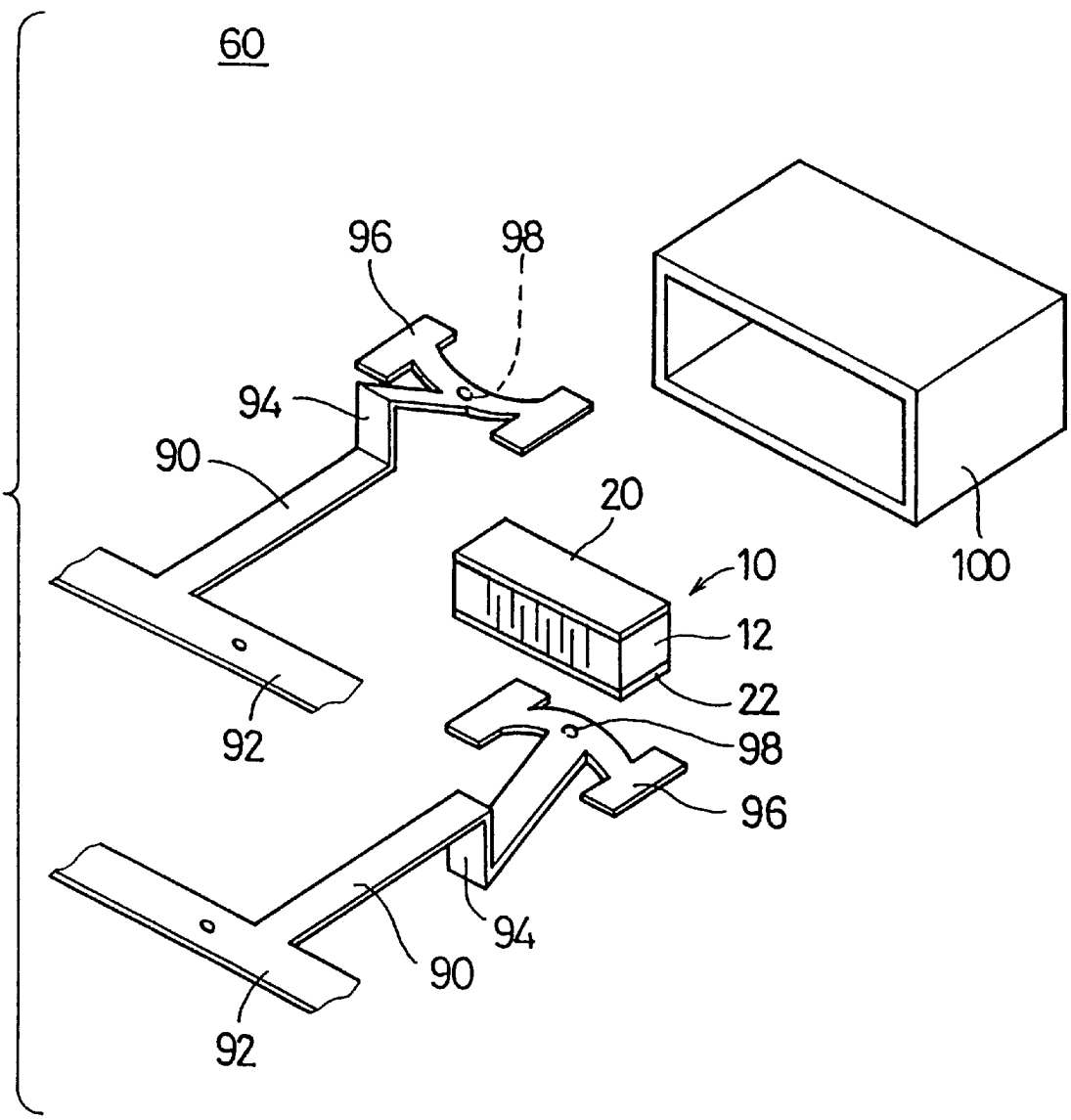
FIG. 37 is an exploded perspective view of a two-terminal electronic component.

A two-terminal electronic component 60 such as a ceramic resonator and a ceramic discriminator can be produced with a piezoelectric resonator 10 as shown in FIG. 37. Two terminals 90 made from an electrically conductive material are prepared to produce such a two-terminal component 60. These terminals 90 are formed such that they extend from hoops 92. Practically, a plurality of terminals 90 are formed on each hoop 92 and are arranged in a line. A terminal 90 is provided with a fold section 94 at the intermediate portion and an H-shaped support member 96 at the end. The support member 96 is bent and is provided with a protruded mounting member 98 at the center. The two terminals 90 are disposed such that their mounting members 98 oppose each other.

The piezoelectric resonator 10 is supported between the mounting members 98. The mounting members 98 abut against the external electrodes 20 and 22 preferably at the center of the piezoelectric resonator in the longitudinal direction, at which a node point is located. Since the terminals 90 have fold sections 94, which serve as spring elements, the piezoelectric resonator 10 is spring-supported by the terminals 90. A case 100 having an opening at one end is placed on the piezoelectric resonator 10. The opening of the case 100 is preferably closed with paper and then resin-sealed. The terminals 90 are cut from the hoops 92 to complete the electronic component 60. The electronic component 60 having a shape other than a chip-shape can thus be made.

Since the preferred embodiments of the present invention uses a stiffened piezoelectric resonator, the resonator has a larger $\Delta F$ and a wider frequency band than the conventional unstiffened piezoelectric resonator. In addition, the stiffened piezoelectric resonator has small spurious vibrations. Since the base member 12 has a laminated structure, the capacitance can be set to any desired value and it is easy to achieve impedance matching with an external circuit. Furthermore, by adjusting the sizes and positions of the active section and the inactive sections, ΔF can easily be changed. Since the electronic component according to the preferred embodiments of the present invention has a simple structure, it can be produced at a low cost while achieving the above-described features of the piezoelectric resonator 10.

Figure 38:
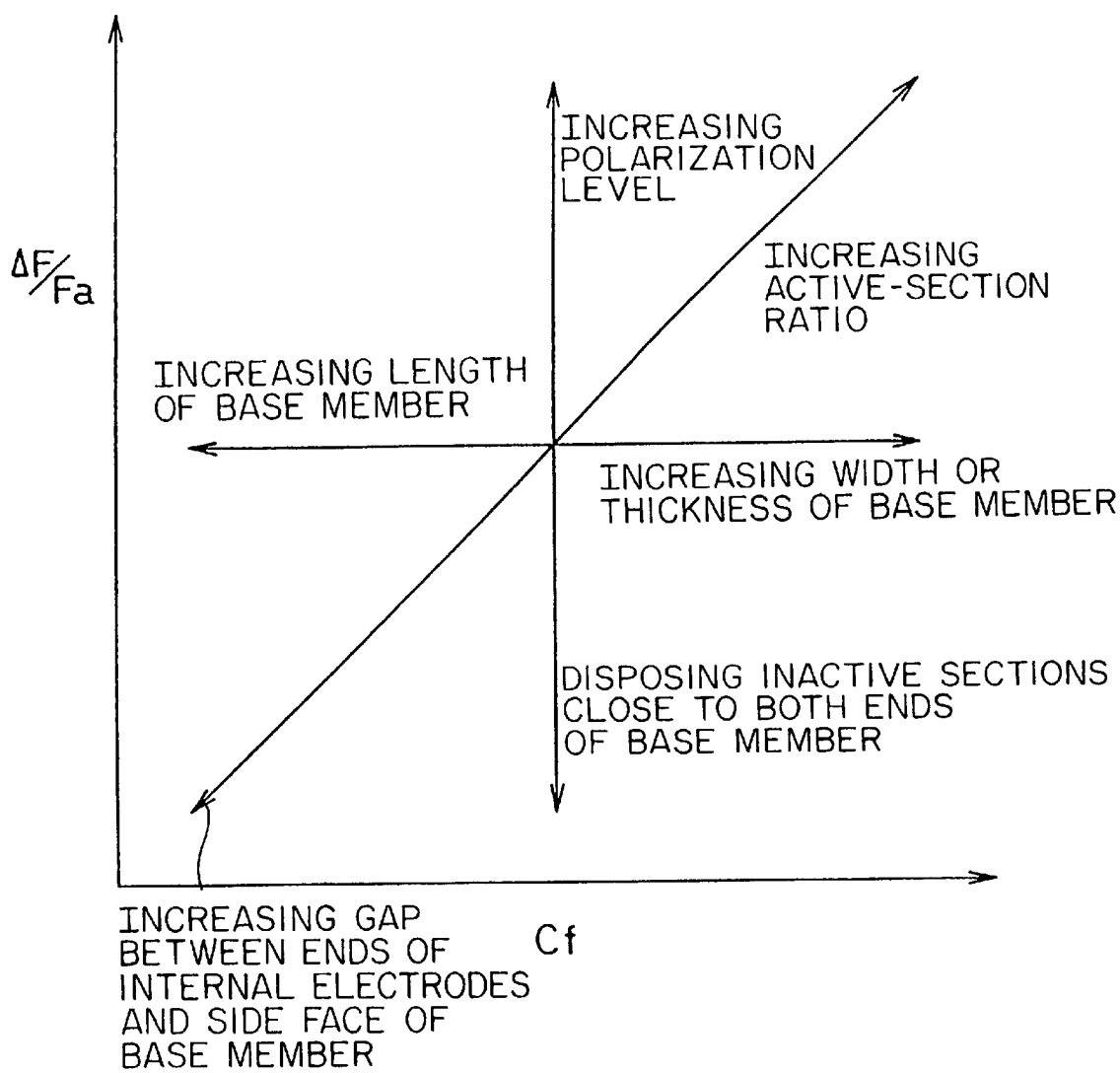
FIG. 38 is a chart indicating the relationship between Cf and $\Delta F/Fa$, and other parameters.
Figure 39:
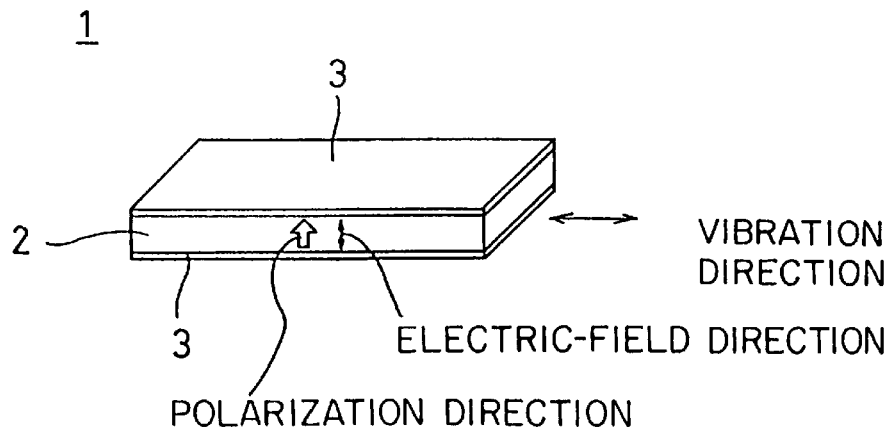
FIG. 39 is a view of a conventional unstiffened piezoelectric resonator.
Figure 40:
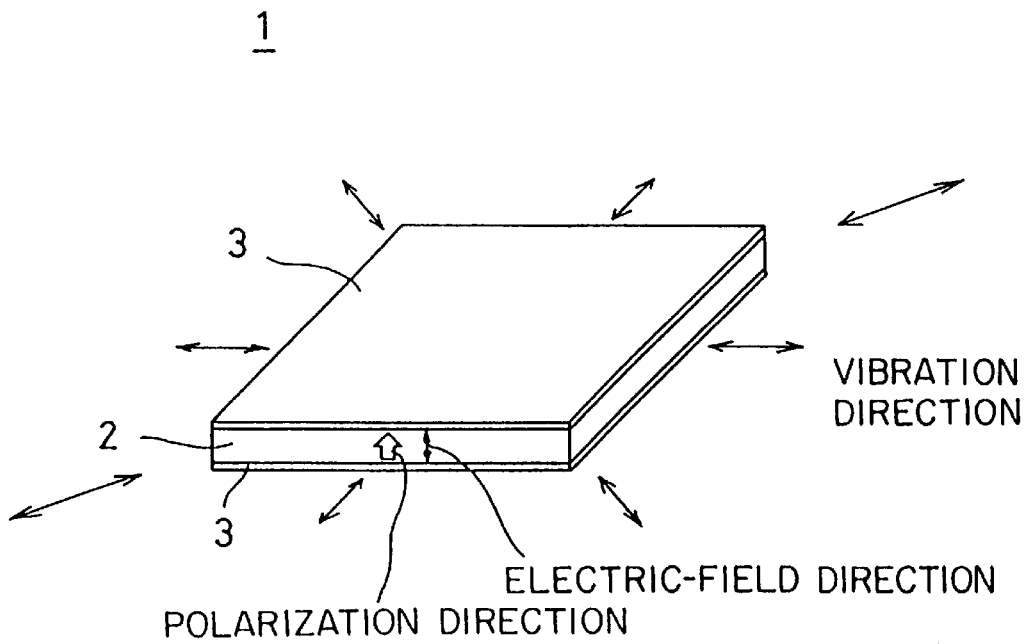
FIG. 40 is a view of another conventional unstiffened piezoelectric resonator.

Since the piezoelectric resonator 10 according to the preferred embodiments of the present invention includes more easily controllable parameters and characteristics than the conventional piezoelectric resonator, various desired resonator characteristics can be implemented. The relationships between these parameters, ΔF/Fa and capacitance Cf are indicated in FIG. 38. It is understood from FIG. 38 that these parameters expand the degree of freedom in designing the characteristics of the piezoelectric resonator 10.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A piezoelectric resonator comprising:
   a base member including a piezoelectric member;
   means for driving said base member;
   an active section constituting a first portion of the piezoelectric base member which is polarized in a longitudinal direction of said base member, and generating a longitudinal vibration in said base member when said means for driving said base member applies an electric field in the longitudinal direction of said base member and such that a node point of the piezoelectric base member is defined approximately at a center point of the piezoelectric base member;
   at least one pair of electrodes disposed in said active section such that the at least one pair of electrodes are substantially perpendicular to the longitudinal direction of said base member; and
   an inactive section constituting a second portion of said piezoelectric base member, said inactive section being at least one of not polarized and not energized by an electric field.

2. A piezoelectric resonator according to claim 1, wherein said inactive section is disposed at opposite ends of said active section.

3. A piezoelectric resonator according to claim 1, wherein said active section occupies at least approximately 50% of a length of said base member.

4. A piezoelectric resonator according to claim 1, wherein said piezoelectric base member comprises an integral stack of piezoelectric members.

5. A piezoelectric resonator according to claim 1, wherein said at least one pair of electrodes comprise internal electrodes, the piezoelectric resonator further comprising a pair of external electrodes each disposed on one of two opposite side surfaces of the base member and extending along a length of the base member.

6. A piezoelectric resonator according to claim 1, further comprising a plurality of electrodes in addition to the at least one pair of electrodes, the plurality of electrodes being disposed in the active section and each including an exposed portion which extends to an external surface of the base member, wherein the plurality of electrodes are alternately covered by insulating film on opposite side surfaces of the base member such that the insulating film covers an exposed portion of every other one of the plurality of electrodes.

7. A piezoelectric resonator according to claim 1, further comprising a plurality of electrodes in addition to the at least one pair of electrodes, the plurality of electrodes being disposed in the active section, wherein the base member is polarized in opposite directions at both sides of at least one of the plurality of electrodes.

8. A piezoelectric resonator according to claim 1, wherein the piezoelectric member comprises a plurality of separate piezoelectric elements stacked to define an integral unit, each of the separate piezoelectric elements being arranged to vibrate in a thickness vibration mode such that the integral unit vibrates in a longitudinal vibration mode.

9. A piezoelectric resonator according to claim 1, wherein a direction of polarization of the base member, a direction of an electric field applied to the base member and a direction vibration of the base member are the same.

10. A piezoelectric resonator according to claim 1, further comprising a support member, and a mounting member disposed between said support member and said base member.

11. A piezoelectric resonator comprising:
    a piezoelectric base member having an inactive section and an active section;
    means for driving said piezoelectric base member; wherein
    the active section is polarized and arranged to vibrate in a longitudinal direction of said base member when said means for driving applies an electric field in the longitudinal direction of said base member, the inactive section being at least one of not polarized and not energized by an electric field; wherein
    a node point of the piezoelectric base member is defined approximately at a center point of the piezoelectric base member when said means for driving applies the electric field in the longitudinal direction of said base member.

12. A piezoelectric resonator according to claim 11, wherein said inactive section is disposed at opposite ends of said active section.

13. A piezoelectric resonator according to claim 11, wherein said active section occupies at least approximately 50% of a length of said base member.

14. A piezoelectric resonator according to claim 11, wherein said piezoelectric base member comprises an integral stack of separate piezoelectric members.

15. A piezoelectric resonator according to claim 11, further comprising at least one pair of internal electrodes disposed in the base member and a pair of external electrodes each disposed on one of two opposite side surfaces of the base member and extending along a length of the base member.

16. A piezoelectric resonator according to claim 11, wherein the piezoelectric member comprises a plurality of separate piezoelectric elements stacked to define an integral unit, each of the separate piezoelectric elements being arranged to vibrate in a thickness vibration mode such that the integral unit vibrates in a longitudinal vibration mode.

17. A piezoelectric resonator according to claim 11, wherein a direction of polarization of the base member, a direction of an electric field applied to the base member and a direction vibration of the base member are the same.

18. A piezoelectric resonator according to claim 11, further comprising a support member, and a mounting member disposed between said support member and the node point of said base member.

19. An electronic component comprising:
    a base member including a piezoelectric member;

means for driving said base member;

an active section constituting a first portion of the piezoelectric base member which is polarized in a longitudinal direction of said base member, and generating a longitudinal basic vibration in said base member when said means for driving said base member applies an electric field in the longitudinal direction of said base member and such that a node point of the piezoelectric base member is defined approximately at a center point of the piezoelectric base member;

at least one pair of electrodes disposed in said active section such that the at least one pair of electrodes are substantially perpendicular to the longitudinal direction of said base member; and an inactive section constituting a second portion of said piezoelectric base member, said inactive section being at least one of not polarized and not energized by an electric field;

a support member including an insulating substrate having a pattern electrode disposed thereon;

a mounting member disposed between the support member and the base member, said base member being mounted to said insulating substrate via said mounting member; and a cap disposed on said insulating substrate so as to cover said base member.

20. An electronic component comprising:

a base member including a piezoelectric member;

means for driving said base member;

an active section constituting a first portion of the piezoelectric base member which is polarized in a longitudinal direction of said base member, and generating a longitudinal basic vibration in said base member when said means for driving said base member applies an electric field in the longitudinal direction of said base member and such that a node point of the piezoelectric base member is defined approximately at a center point of the piezoelectric base member;

at least one pair of electrodes disposed in said active section such that the at least one pair of electrodes are substantially perpendicular to the longitudinal direction of said base member;

an inactive section constituting a second portion of said piezoelectric base member, said inactive section being at least one of not polarized and not energized by an electric field;

a support member including an insulating substrate having a pattern electrode disposed thereon;

a mounting member disposed between the support member and the base member, said base member being mounted to said insulating substrate via said mounting member;

a plurality of base members connected in series and in parallel in a ladder arrangement on said insulating substrate via said mounting member; and a cap disposed on said insulating substrate so as to cover said plurality of base members.

\* \* \* \* \*